United States Patent
Lee et al.

(10) Patent No.: US 11,280,860 B2
(45) Date of Patent: Mar. 22, 2022

(54) METHOD FOR GENERATING MRI RF PULSE AND DEVICE FOR THE SAME

(71) Applicant: SEOUL NATIONAL UNIVERSITY R&DB FOUNDATION, Seoul (KR)

(72) Inventors: Jongho Lee, Seoul (KR); Dongmyung Shin, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 17/168,274

(22) Filed: Feb. 5, 2021

(65) Prior Publication Data

US 2022/0057461 A1 Feb. 24, 2022

(30) Foreign Application Priority Data

Aug. 24, 2020 (KR) .......................... 10-2020-0106569

(51) Int. Cl.
*G01R 33/36* (2006.01)
*G01R 33/54* (2006.01)

(52) U.S. Cl.
CPC ....... *G01R 33/3607* (2013.01); *G01R 33/543* (2013.01)

(58) Field of Classification Search
CPC .......................... G01R 33/3607; G01R 33/543
See application file for complete search history.

(56) References Cited

U.S. PATENT DOCUMENTS

2012/0065073 A1* 3/2012 Maher ................... H01F 41/048
505/162
2018/0149722 A1* 5/2018 Sbrizzi ................. G01R 33/243

* cited by examiner

*Primary Examiner* — G.M. A Hyder
(74) *Attorney, Agent, or Firm* — Mayer & Williams, PC; Stuart H. Mayer

(57) ABSTRACT

Disclosed is an MRI control signal providing method including obtaining an initial control variable array including time-series values of a control variable for controlling a spatial profile of an induced magnetic field induced by an MRI scanner, obtaining information about a desired spatial profile of the induced magnetic field in the MRI scanner, calculating a differentiation array obtainable by partially differentiating a predetermined function with respect to the control variable, and calculating a scaled array obtained by scaling the differentiation array with a predetermined scaling factor, and generating an updated control variable array from the initial control variable array by subtracting values of the scaled array from values of the initial control variable array.

13 Claims, 17 Drawing Sheets

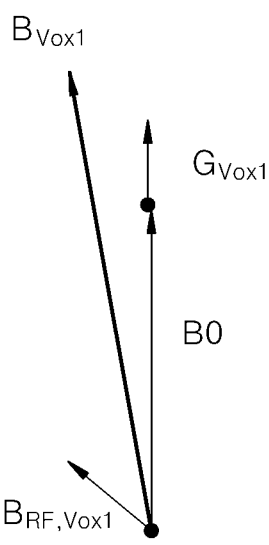 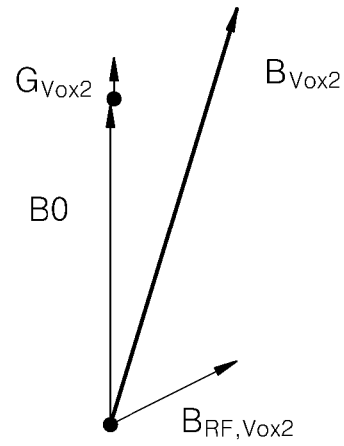
at Voxel #1 at t1      at Voxel #2 at t2
FIG. 2A      FIG. 2B

METHOD FOR GENERATING MRI RF PULSE AND DEVICE FOR THE SAME

CROSS-REFERENCE TO RELATED APPLICATION

This application claims priority to Korean Patent Application No. 10-2020-0106569 filed on Aug. 24, 2020, and all the benefits accruing therefrom under 35 U.S.C. § 119, the contents of which are incorporated by reference in their entirety.

BACKGROUND

The present disclosure relates to a signal processing technique for generating a signal used in an MRI scanner. The present disclosure particularly relates to a technique for determining waveforms of an RF pulse and gradient magnetic field over time.

An MRI scanner may provide, within a scan space in the MRI scanner, a magnetic field determined by a vector sum of a fixed magnetic field B0 that does not change according to a position and time, a gradient magnetic field $G_{x,y,z}(t)$ that may change according to time and may linearly vary in magnitude in a particular direction in the space, and a variable magnetic field $B_{RF}$ provided since an RF pulse is applied.

Due to the magnetic field provided by the MRI scanner, an induced magnetic field may be formed in each position of a scan target object disposed in the scan space. The induced magnetic field may have different values according to each position in the scan space. In the present disclosure, for example, a pattern of the induced magnetic field according to x-axis, y-axis, and z-axis directions may be referred to as a spatial profile. An operator of such an MRI scanner may desire that the spatial profile of the induced magnetic field have a desired shape.

SUMMARY

The present disclosure provides a technology of designing the gradient magnetic field and RF pulse so as to achieve a preferred spatial profile of an induced magnetic field, which is desired by an operator of an MRI scanner.

FIGS. 1A-1F are diagrams for describing a pattern of a magnetic field in a scan space of an MRI scanner to which an RF pulse is applied.

As illustrated in the part (a) of FIG. 1, a fixed magnetic field B0 oriented in a first direction, for example, z-axis direction, may be provided in the scan space of the MRI scanner. The fixed magnetic field B0 constantly has the same magnitude at arbitrary coordinates (x,y,z) in the scan space. Furthermore, the fixed magnetic field B0 is constantly oriented in the first direction at the arbitrary coordinates (x,y,z) in the scan space.

Furthermore, a gradient magnetic field $G_{x,y,z}(t)$ may be additionally provided in the scan space of the MRI scanner. The gradient magnetic field $G_{x,y,z}(t)$ may be constantly oriented in the first direction at arbitrary spatial coordinates (x,y,z) in the scan space. However, the gradient magnetic field $G_{x,y,z}(t)$ may have a magnitude controlled according to a predefined rule at each of spatial coordinates (x,y,z). The gradient magnetic field $G_{x,y,z}(t)$ may have different magnitudes according to the spatial coordinates (x,y,z).

Change patterns of the magnitude of the gradient magnetic field $G_{x,y,z}(t)$ according to a space may be classified and defined as three patterns.

That is, as illustrated in each of the part (b) of FIG. 1, the part (c) of FIG. 1, and the part (d) of FIG. 1, the gradient magnetic field may be controlled to linearly increase or decrease in magnitude along x-axis, y-axis, and z-axis directions from an origin point defined on the x-axis, an origin point defined on the y-axis, and an origin point defined on the z-axis. Here, a change rate of the magnitude or intensity of the gradient magnetic field per unit distance along the x-axis direction may be referred to by $\Delta Gx$, the change rate of the magnitude or intensity of the gradient magnetic field per unit distance along the y-axis direction may be referred to by $\Delta Gy$, and the change rate of the magnitude or intensity of the gradient magnetic field per unit distance along the z-axis direction may be referred to by $\Delta Gz$.

Each of $\Delta Gx$, $\Delta Gy$, and $\Delta Gz$ may change according to time. Here, $\Delta Gx$, $\Delta Gy$, and $\Delta Gz$ may be respectively expressed as $\Delta Gx(t)$, $\Delta Gy(t)$, and $\Delta Gz(t)$. Change patterns of $\Delta Gx(t)$, $\Delta Gy(t)$, and $\Delta Gz(t)$ according to time have values settable in the MRI scanner.

It would be easily understood that when the change patterns of $\Delta Gx(t)$, $\Delta Gy(t)$, and $\Delta Gz(t)$ according to time are defined, the magnitude of the gradient magnetic field $G_{x,y,z}(t)$ at arbitrary spatial coordinates (x,y,z) in the scan space and at an arbitrary time may be recognized.

An RF pulse having an amplitude and phase which change according to time may be applied in the scan space. The part (e) of FIG. 1 exemplarily illustrates a change in the amplitude of the RF pulse according to time, and the part (f) of FIG. 1 exemplarily illustrates a change in the phase of the RF pulse according to time. When the RF pulse is applied to the scan space, a variable magnetic field $B_{RF}$ provided by the RF pulse may be additionally provided to each of spatial coordinates (x,y,z) of the scan space.

FIG. 2 is a diagram for describing a voxel magnetic field induced at different spatial coordinates (x,y,z) in the scan space.

FIG. 3 illustrates voxels defined by dividing the scan space of the MRI scanner into multiple sub spaces according to a predefined rule, and examples of a desired spatial profile of an induced magnetic field that is induced from voxels arranged in a particular direction and a spatial profile of an induced magnetic field that is actually induced when a schemed RF pulse and schemed gradient magnetic field are applied. One cubic of a basic unit that may be recognized from FIG. 3 represents one voxel.

Descriptions will be given with reference to both FIGS. 2 and 3.

As illustrated in the part (a) of FIG. 3, the scan space of the MRI scanner may be divided into multiple sub spaces according to the predefined rule, wherein each of the sub spaces may be referred to as a voxel. That is, the scan space may be defined as one including a plurality of voxels. A boundary shape of each voxel may be arbitrary determined, but, in an embodiment, each voxel may be defined in a cubic form as illustrated in the part (a) of FIG. 3.

As illustrated in the part (a) of FIG. 3, the scan space may be defined as a set of voxels arranged adjacent to each other in a three-dimensional matrix form. In this case, each voxel may be expressed as V(p,q,r) or Vox(p,q,r) in order to distinguish each voxel, where p, q, and r respectively denote an index given along the x direction of the voxel, an index given along the y direction, and an index given along the z direction.

When an MRI scan target object occupies only a portion of the scan space, each voxel may include or may not include a portion of the MRI scan target object. An example of the MRI scan target object may include an organism or organic matter.

Since a single voxel may have a volume that is not zero, voxel magnetic fields $B_{Vox}$ provided as a vector sum of the fixed magnetic field B0, the gradient magnetic field $G_{x,y,z}(t)$, and the variable magnetic field $B_{RF}$ provided by an RF pulse may have different values at various positions in the single voxel. However, when the single voxel is defined to have a sufficiently small size, the values of the voxel magnetic fields $B_{Vox}$ provided at each position in the single voxel may approximate to the same value. Therefore, a voxel magnetic field provided by the MRI scanner in a particular voxel may be expressed as a single value $B_{Vox}$. It is obvious that voxel magnetic fields provided to different voxels may have different values.

A magnetic field provided to a single particular voxel by the MRI scanner may be presented as a vector expressed as the intensity and direction of the magnetic field. At the moment when a gradient magnetic field and an RF pulse are provided in the scan space of the MRI scanner, the voxel magnetic field $B_{Vox}$ provided to a single particular voxel may be defined as a vector sum of the fixed magnetic field B0, the gradient magnetic field $G_{Vox}$ provided to the particular voxel, and the variable magnetic field $B_{RF,Vox}$ provided to the particular voxel by the provided RF pulse.

For example, as illustrated in the parts (a) and (b) of FIG. 2, a first gradient magnetic field $G_{Vox1}$ and a second gradient magnetic field $G_{Vox2}$ provided to a first voxel Vox1 and a second voxel Vox2 may be the same or different, and a first variable magnetic field $B_{RFVox1}$ and a second variable magnetic field $B_{RFVox2}$ provided by the RF pulse may also be the same or different. Therefore, as illustrated in the parts (a) and (b) of FIG. 2, a first voxel magnetic field $B_{Vox1}$ and a second voxel magnetic field $B_{Vox2}$ may be different.

When the MRI scan target object is present in a single voxel, and when the MRI scan target object includes water molecules, the induced magnetic field $M_{Vox}$ may be formed on the MRI scan target object due to the voxel magnetic field $B_{Vox}$ provided to the single voxel. That is, the induced magnetic field $M_{Vox}$ that is induced and formed in a particular voxel may be determined by the voxel magnetic field $B_{Vox}$ provided to the particular voxel by the MRI scanner.

This induced magnetic field $M_{Vox}$ may be defined for each voxel, and may be formed to have the same value or different values for each voxel.

An induced magnetic field formed for a given single voxel may be expressed as a vector. For example, the induced magnetic field $M_{Vox}$ may be decomposed into an x component $Mx_{Vox}$, a y component $My_{Vox}$, and a z component $Mz_{Vox}$ so as to be presented. The x component $Mx_{Vox}$ may represent an x-axis direction component of the induced magnetic field, the y component $My_{Vox}$ may represent a y-axis direction component of the induced magnetic field, and the z component $Mz_{Vox}$ may represent a z-axis direction component.

Here, in the part (a) of FIG. 3, for example, in a state in which a voxel index q of the y axis and a voxel index r of the z axis are fixed to particular values, particular components of the induced magnetic fields formed on a row of voxels arranged along the x axis, for example, the z component $Mz_{Vox}$, may be considered.

Here, as illustrated in the parts (b) and (c) of FIG. 3, when considering a graph space in which a horizontal axis is defined as the x axis (or p axis), and a vertical axis represents a magnitude of the z component $Mz_{Vox}$, a single graph may be obtained by displaying, in the graph space, the z components $Mz_{Vox}$ obtained for the row of voxels arranged along the axis direction.

This graph may be referred to as a spatial profile of an induced magnetic field that is formed on an MRI scan target object by a given MRI scanner.

Although the parts (b) and (c) of FIG. 3 illustrate that the graphs are continuous along the horizontal axes, the horizontal axes, which are for distinguishing a limited number of voxels, may be actually discrete. Thus, the graphs illustrated in the parts (b) and (c) of FIG. 3 may be construed as being presented by interpolating points illustrated for each voxel.

The spatial profile of the induced magnetic field that is formed on the MRI scan target object due to the applied RF pulse may be presented in various aspects.

In an example, spatial distribution of characteristic values of the induced magnetic field obtained for an arbitrary group of voxels selected according to one aspect may be defined as a spatial profile of the induced magnetic field. For more specific example, spatial distribution of component values of a particular direction, for example, the z-axis direction, of the induced magnetic field obtained for a group of voxels selected according to one aspect may be defined as a spatial profile of the induced magnetic field.

The arbitrary group of voxels selected according to one aspect, for example, may be configured with a plurality of voxels arbitrarily selected from the plurality of voxels illustrated in FIG. 3 without particularly limiting values of the x axis, y axis and z axis.

Alternatively, in a state in which values of two axes among the x axis, y axis and z axis are fixed, the arbitrary group of voxels selected according to one aspect may be configured with a plurality of voxels selected from the other one axis.

In another example, spatial distribution of component values of a particular direction of the induced magnetic field obtained for a row of selected voxels arranged in a particular axis direction may be defined as a spatial profile of the induced magnetic field. Here, the particular axis direction may be the x, y, or z direction.

The parts (b) and (c) of FIG. 3 illustrate spatial profiles presented along the x direction.

The parts (b) and (c) of FIG. 3 exemplarily illustrate spatial profiles of induced magnetic fields for a group of voxels continuously selected along a straight line of the x axis (p axis). However, unlike this illustration, such a spatial profile may also be defined by a set of arbitrary voxels spaced apart from each other in the scan space. However, in this case, it is difficult to display the spatial profile on paper.

Furthermore, a component of a particular direction of the induced magnetic field $M_{Vox}$ may be an x-axis direction component $Mx_{Vox}$ of the induced magnetic field $M_{Vox}$, a y-axis direction component $My_{Vox}$ of the induced magnetic field $M_{Vox}$, or a z-axis direction component $Mz_{Vox}$ of the induced magnetic field $M_{Vox}$. The parts (b) and (c) of FIG. 3 exemplarily illustrates the z-axis direction component $Mz_{Vox}$ of the induced magnetic field $M_{Vox}$.

Here, the spatial profile of the induced magnetic field $M_{Vox}$ is determined by the voxel magnetic field $B_{Vox}$ applied to each voxel, wherein the voxel magnetic field $B_{Vox}$ is determined by a gradient magnetic field and RF pulse. Therefore, it would be understood that the spatial profile of the induced magnetic field $M_{Vox}$ varies according to specific shapes of the gradient magnetic field and RF pulse.

The part (b) of FIG. 3 illustrates an example of a desired spatial profile of an induced magnetic field presented to satisfy an application desired by an operator of an MRI scanner, and the part (c) of FIG. 3 illustrates an example of an undesired spatial profile of an induced magnetic field simulated when a given RF pulse is applied.

According one aspect of the present invention, an MRI control signal providing method may be provided. The method comprises, obtaining, by a computing device, a control variable array including time-series values of a control variable for controlling a spatial profile of an induced magnetic field induced by an MRI scanner; calculating, by the computing device, a differentiation array obtainable by partially differentiating a predetermined function with respect to the control variable, and calculating a scaled array obtained by scaling the differentiation array with a predetermined scaling factor; and generating, by the computing device, an updated control variable array from the control variable array by subtracting values of the scaled array from values of the control variable array, wherein the predetermined function receives, as input variables, a fixed magnetic field provided by the MRI scanner, the control variable array, and information about a desired spatial profile of the induced magnetic field in the MRI scanner, wherein an output value of the predetermined function is a distance between simulated spatial profile values of the induced magnetic field and desired spatial profile values of the induced magnetic field.

Here, the control variable may comprises a variable indicating an amplitude of an RF pulse output from the MRI scanner; a variable indicating a phase of the RF pulse; a variable indicating a value of a real part of the RF pulse; a variable indicating a value of an imaginary part of the RF pulse; a variable indicating a change rate of a magnitude or intensity of a gradient magnetic field per unit distance along an x-axis direction in a scan space of the MRI scanner; a variable indicating the change rate of the magnitude or intensity of the gradient magnetic field per unit distance along a y-axis direction in the scan space; or a variable indicating the change rate of the magnitude or intensity of the gradient magnetic field per unit distance along a z-axis direction in the scan space.

In an embodiment of the present invention, a variable indicating the amplitude of an RF pulse output from the MRI scanner and a variable indicating the phase of the RF pulse may be used as control variables. However, in another embodiment, instead of such variables, a variable indicating a value of a real part of the RF pulse and a variable indicating an imaginary part of the RF pulse may be used.

Here, the plurality of control variables may comprise a variable indicating an amplitude of an RF pulse output from the MRI scanner and a variable indicating a phase of the RF pulse; or a variable indicating a value of a real part of the RF pulse and a variable indicating an imaginary part of the RF pulse.

Here, the simulated spatial profile values of the induced magnetic field may be values of an induced magnetic field calculated by a simulation at a set of voxels selected from among a plurality of voxels defined in a scan space of the MRI scanner, and the desired spatial profile values of the induced magnetic field may be values of an induced magnetic field predefined for the set of voxels selected.

In an embodiment of the present invention, a set of voxels selected from among a plurality of voxels defined in the scan space of the MRI scanner may be used. Here, for example, the selected set of voxels may be a row of voxels arranged continuously along the x-axis, a row of voxels arranged continuously along the y-axis, or a row of voxels arranged continuously along the z-axis.

Alternatively, the selected set of voxels may be a set of voxels having a particular x value and present on a y-z plane, a set of voxels having a particular y value and present on an x-z plane, or a set of voxels having a particular z value and present on an x-y plane.

Alternatively, the selected set of voxels may be a set of voxels arbitrarily selected in an x-y-z space or selected according to a predetermined rule. Here, the selected set of voxels may not be present on a single line and may not be present on a single plane.

Alternatively, the set of voxels may be a single row of voxels arranged along an axis direction selected from among x-axis, y-axis, and z-axis directions defined in the scan space.

Here, the set of voxels may be voxels selected according to a predetermined rule from among all of the voxels defined in the scan space, and the distance may be a distance between component values indicating components of a particular direction among the values of an induced magnetic field calculated by the simulation and component values indicating components of the particular direction among the values of the induced magnetic field predefined.

Here, the simulated spatial profile values of the induced magnetic field and the desired spatial profile values of the induced magnetic field may comprise the same number of elements, and wherein a procedure of calculating the distance may comprises: calculating difference values between the simulated spatial profile values of the induced magnetic field and the desired spatial profile values of the induced magnetic field corresponding thereto; calculating a square of each of the difference values; and setting a value obtained by adding up all of the calculated squares as the distance.

Here, the method may comprise a control signal updating process including the obtaining, the calculating, and the generating, wherein the control signal updating process is repeatedly executed until the distance reaches a predetermined threshold value or less, and, when the distance reaches the predetermined threshold value or less, information about the control signal is provided to a control device of the MRI scanner or a storage device readable by the control device, and wherein each time the updating process is executed, the updated control variable array replaces the control variable array.

Here, the calculating of the differentiation array may be performed using an automatic differentiation part including a computation graph with the predetermined function as a target function.

An MRI control signal providing method provided according to another aspect of the present invention includes: obtaining, by a computing device, a plurality of control variable arrays each including time-series values of a plurality of control variables for controlling a spatial profile of an induced magnetic field induced by the MRI scanner; calculating, by the computing device, a plurality of differentiation arrays obtainable by partially differentiating a predetermined function with respect to each of the control variables, and calculating a plurality of scaled arrays obtained by scaling each of the differentiation arrays with a predetermined scaling factor; and generating, by the computing device, a plurality of updated control variable arrays from the plurality of control variable arrays by subtracting values of each of the scaled arrays from values of the corresponding control variable array. Here, the predetermined function receives, as input variables, a fixed magnetic field provided by the MRI scanner, the plurality of control variable arrays, and information about a desired spatial profile of the induced magnetic field in the MRI scanner, and an output value of the predetermined function is a distance between simulated spatial profile values of the induced magnetic field and desired spatial profile values of the induced magnetic field.

The method may further include providing, by the computing device, information about the plurality of updated control variable arrays to a control device of the MRI scanner or a storage device readable by the control device as information for generating a driving current of coils of the MRI scanner.

Here, the plurality of control variables may include a variable indicating an amplitude of an RF pulse output from the MRI scanner and a variable indicating a phase of the RF pulse, or a variable indicating a value of a real part of the RF pulse and a variable indicating an imaginary part of the RF pulse.

Here, the plurality of control variables may include a variable indicating a change rate of a magnitude or intensity of a gradient magnetic field per unit distance along an x-axis direction in a scan space of the MRI scanner, a variable indicating the change rate of the magnitude or intensity of the gradient magnetic field per unit distance along a y-axis direction in the scan space, and a variable indicating the change rate of the magnitude or intensity of the gradient magnetic field per unit distance along a z-axis direction in the scan space.

According to one aspect of the present invention, a computing device for controlling an MRI scanner can be provided. The computing device comprises a communication interface and a processing part. The processing part is configured to: obtain a plurality of control variable arrays each including time-series values of a plurality of control variables for controlling a spatial profile of an induced magnetic field induced by the MRI scanner; calculate a plurality of differentiation arrays obtainable by partially differentiating a predetermined function with respect to each of the control variables, and calculate a plurality of scaled arrays obtained by scaling each of the differentiation arrays with a predetermined scaling factor; and generate a plurality of updated control variable arrays from the plurality of control variable arrays by subtracting values of each of the scaled arrays from values of the corresponding control variable array, wherein the predetermined function receives, as input variables, a fixed magnetic field provided by the MRI scanner, the plurality of control variable arrays, and information about a desired spatial profile of the induced magnetic field in the MRI scanner, wherein an output value of the predetermined function is a distance between simulated spatial profile values of the induced magnetic field and desired spatial profile values of the induced magnetic field in the MRI scanner.

Here, the processing part may be configured to provide information about the plurality of updated control variable arrays to a control device of the MRI scanner or a storage device readable by the control device via the communication interface as information for generating a driving current of coils of the MRI scanner.

According to another aspect of the present invention, a computing device including a communication interface and a processing part may be provided. Here, the processing part is configured to obtain a plurality of control variable arrays each including time-series values of a plurality of control variables for controlling a spatial profile of an induced magnetic field induced by an MRI scanner. Furthermore, the processing part is configured to calculate a plurality of differentiation arrays obtainable by partially differentiating a predetermined function with respect to each of the control variables, and calculate a plurality of scaled arrays obtained by scaling each of the differentiation arrays with a predetermined scaling factor. Furthermore, the processing part is configured to generate a plurality of updated control variable arrays from the plurality of control variable arrays by subtracting values of each of the scaled arrays from values of the corresponding control variable array. Here, the predetermined function receives, as input variables, a fixed magnetic field provided by the MRI scanner, the plurality of control variable arrays, and information about a desired spatial profile of the induced magnetic field in the MRI scanner. Furthermore, an output value of the predetermined function is a distance between simulated spatial profile values of the induced magnetic field and desired spatial profile values of the induced magnetic field in the MRI scanner.

The computing device may be one for controlling an MRI scanner.

According to another aspect of the present invention, a method for driving an MRI device including an MRI scanner and an MRI scanner control device may be provided. The method may include obtaining, by the MRI scanner control device, a control variable array including time-series values of a control variable for controlling a spatial profile of an induced magnetic field induced by the MRI scanner. Furthermore, the method may include calculating, by the MRI scanner control device, a differentiation array obtainable by partially differentiating a predetermined function with respect to the control variable, and calculating a scaled array obtained by scaling the differentiation array with a predetermined scaling factor. Furthermore, the method may include generating, by the MRI scanner control device, an updated control variable array from the control variable array by subtracting values of the scaled array from values of the control variable array. Furthermore, the method may include applying, by the MRI scanner, a driving current generated using the time-series values of the control variable included in the updated control variable array to a coil included in the MRI scanner.

Here, the predetermined function may receive, as input variables, a fixed magnetic field provided by the MRI scanner, the control variable array, and information about a desired spatial profile of the induced magnetic field in the MRI scanner. Furthermore, an output value of the predetermined function may be a distance between simulated spatial profile values of the induced magnetic field and desired spatial profile values of the induced magnetic field.

BRIEF DESCRIPTION OF THE DRAWINGS

Exemplary embodiments can be understood in more detail from the following description taken in conjunction with the accompanying drawings, in which:

FIG. 2A and FIG. 2B are diagrams for describing a voxel magnetic field induced at different points in a scan space;

DETAILED DESCRIPTION OF EMBODIMENTS

Figure 1A:
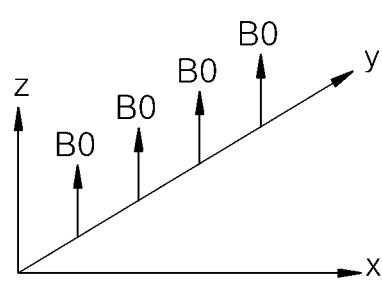
FIG. 1A, FIG. 1B, FIG. 1C, FIG. 1D, FIG. 1E and FIG. 1F are diagrams for describing a magnetic field in a scan space of an MRI scanner to which an RF pulse is applied.
Figure 1B:
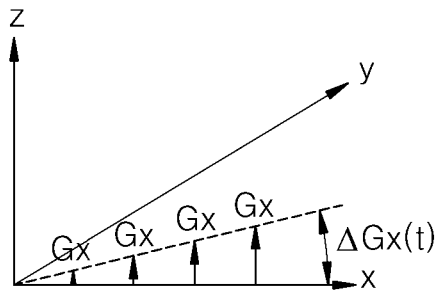
Figure 1C:
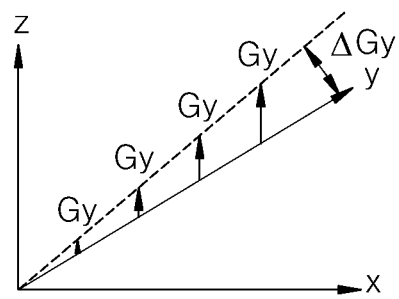
Figure 1D:
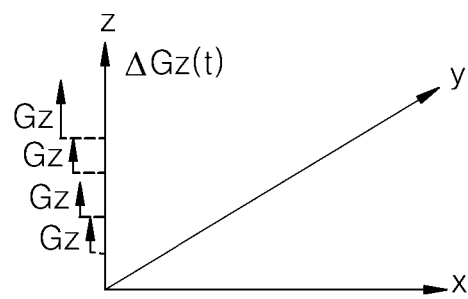
Figure 1E:
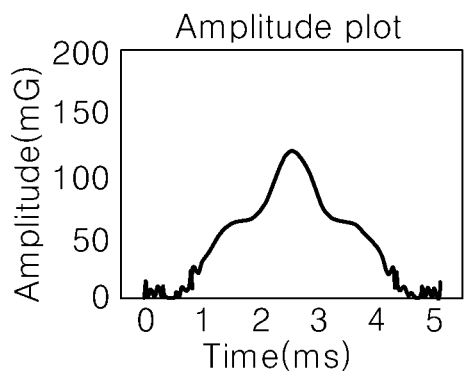
Figure 1F:
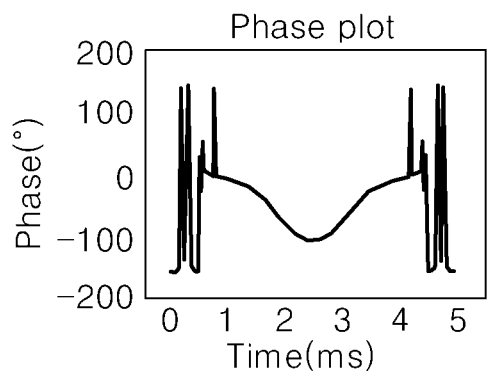
Figure 3A:
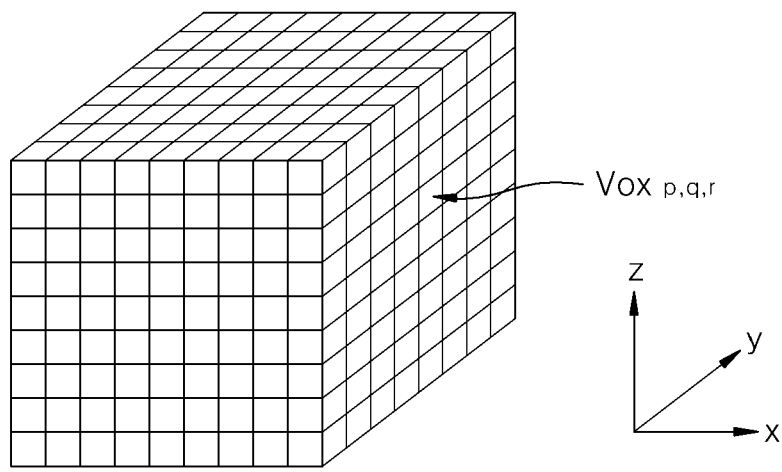
FIG. 3A, FIG. 3B and FIG. 3C illustrate voxels defined by dividing a scan space of an MRI scanner into multiple sub spaces according to a predefined rule, and examples of a desired profile of an induced magnetic field that is induced from voxels arranged in a particular direction and a profile of an induced magnetic field that is actually induced when a schemed RF pulse and schemed gradient magnetic field are applied.
Figure 3B:
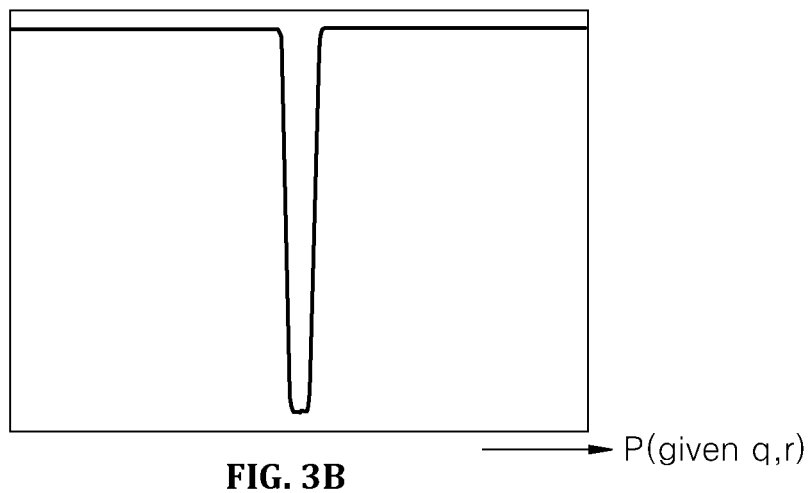
Figure 3C:
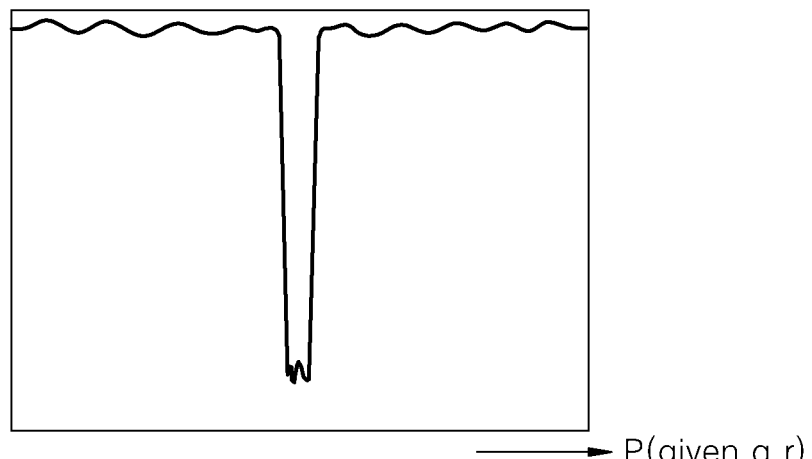

Embodiments of the present invention will be described with reference to the accompanying drawings. However, the present invention is not limited to the embodiments described herein, and may be implemented in various different forms. The terminology used herein is not for limiting the scope of the present invention but for describing the embodiments. Furthermore, the singular forms used herein include the plural forms as well, unless otherwise indicated.

Hereinafter, examples of an RF pulse and two methods of expressing an RF pulse, addressed in the present invention, will be described with reference to Equation 1 and Equation 2.

An RF pulse may be a signal having a complex value that changes according to time. As illustrated in the part (e) of FIG. 1, the RF pulse may have an amplitude that changes according to time. As illustrated in the part (f) of FIG. 1, the RF pulse may have a phase that changes according to time.

As shown in Equation 1 and Equation 2 below, the RF pulse may be expressed as RF[n] indicating values sampled on a time axis at a predetermined period, where n may be a natural number.

$$RF[n] = \text{Re}[n] + j^*Im[n] = \text{var1}[n] + j^*\text{var2}[n] \qquad \text{[Equation 1]}$$

$$RF[n] = \text{Amp}[n]^*\exp\{j^*\text{phase}[n]\} = \text{var1}[n]^*\exp\{j^*\text{var2}[n]\} \qquad \text{[Equation 2]}$$

When n has at least a particular value in Equation 1 and Equation 2, var1[n] and var2[n] may be constantly 0. That is, RF[n] may be a pulse having a finite length.

The RF pulse RF[n] may represent a signal emitted from an RF pulse radiating coil provided to an MRI scanner.

Alternatively, the RF pulse RF[n] may represent a signal of an RF pulse driving current applied to the coil or a control signal for controlling a flow of the driving current.

The RF pulse driving current may be provided as continuous values, but it would be understood that the control signal for controlling the RF pulse driving current may be provided as discrete values. Therefore, as shown in Equation 1 and Equation 2, the symbol n which indicates discrete time may be used instead of the symbol t which indicates continuous time.

In an embodiment represented by Equation 1, each sampled RF pulse RF[n] may include a real part Re[n] and an imaginary part Im[n]. Here, the real part Re[n] may be regarded as a first control variable var1[n], and the imaginary part Im[n] may be regarded as a second control variable var2[n]. An array of RF pulses RF[n] sampled at different time points may include an array of the first control variables var1[n] and an array of the second control variables var2[n].

In another embodiment represented by Equation 2, each sampled RF pulse RF[n] may include an amplitude part Amp[n] and a phase part phase[n]. Here, the amplitude part Amp[n] may be regarded as the first control variable var1[n], and the phase part phase[n] may be regarded as the second control variable var2[n]. An array of RF pulses RF[n] sampled at different time points may include an array of the first control variables var1[n] and an array of the second control variables var2[n].

With regard to above-described Equation 1 and Equation 2, it may be recognized that the array of RF pulses RF[n] sampled at different time points may include an array of the first control variables var1[n] and an array of the second control variables var2[n] regardless of in which form the RF pulse RF[n] is expressed.

Hereinafter, the RF pulse RF[n] will be described as following Equation 2 in a preferred embodiment of the present invention, but the concept of the present invention described below may also be applied even when the RF pulse RF[n] is presented in the form of Equation 1.

A profile of the amplitude of the RF pulse according to time may be determined by an array including variables var1[n] (=Amp[n]) defined for different values of n.

Furthermore, a profile of the phase of the RF pulse according to time may be determined by an array including variables var2[n] (=phase[n]) defined for different values of n.

A gradient magnetic field $G_{x,y,z}(t)$ may be provided by a group of coils arranged in the MRI scanner. Here, ΔGx(t), ΔGy(t), and ΔGz(t) may be expressed as discrete time ΔGx[n], ΔGy[n], and ΔGz[n].

As shown in Equation 3, Equation 4, and Equation 5, ΔGx[n], ΔGy[n], and ΔGz[n] may be respectively expressed as var3[n], var4[n], and var5[n].

$$\Delta Gx[n] = \text{var3}[n] \qquad \text{[Equation 3]}$$

$$\Delta Gy[n] = \text{var4}[n] \qquad \text{[Equation 4]}$$

$$\Delta Gz[n] = \text{var5}[n] \qquad \text{[Equation 5]}$$

Here, a profile of a change rate of a magnitude or intensity of the gradient magnetic field per unit distance along the x-axis direction according to time may be determined by an array including variables var3[n] (=ΔGx[n]) defined for different values of n. Here, n is a parameter indicating time.

Furthermore, the profile of the change rate of the magnitude or intensity of the gradient magnetic field per unit distance along the y-axis direction according to time may be determined by an array including variables var4[n] (=ΔGy[n]) defined for different values of n.

Furthermore, the profile of the change rate of the magnitude or intensity of the gradient magnetic field per unit distance along the z-axis direction according to time may be determined by an array including variables var5[n] (=ΔGz[n]) defined for different values of n.

Figure 4:
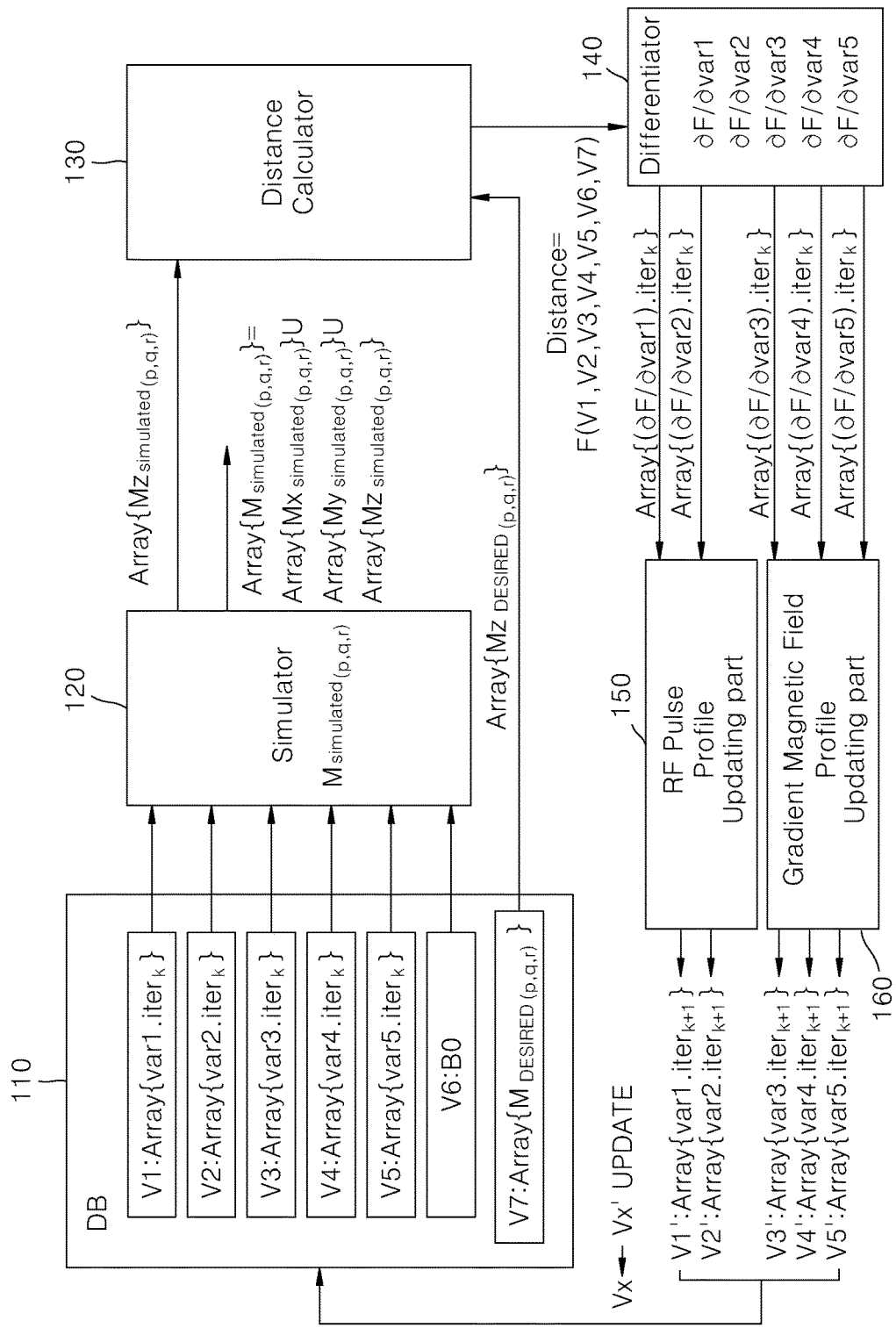
FIG. 4 is a block diagram illustrating a method of generating an RF pulse and a gradient magnetic field, provided according to one embodiment of the present invention.

FIG. 4 is a block diagram illustrating a method of generating an RF pulse and a gradient magnetic field, provided according to one embodiment of the present invention.

Each of the blocks illustrated in FIG. 4 may be executed on a computing device. The computing device may be provided with a simulator 120 implemented as software. Alternatively, the simulator 120 may be provided as a dedicated hardware device. The simulator 120 may receive six types of variables from a DB 110. The DB 110 may be provided inside or outside the computing device.

The six types of variables are described as below.

A first variable V1 is a first array Array{var1.iter$_k$} including the first control variables var1[n] that constitute the above-described RF pulse.

A second variable V2 is a second array Array{var2.iter$_k$} including the second control variables var2[n] that constitute the above-described RF pulse.

A third variable V3 is a third array Array{var3.iter$_k$} including variables var3[n] (=ΔGx[n]) indicating the profile of the change rate of the magnitude or intensity of the gradient magnetic field per unit distance along the x-axis direction according to time.

A fourth variable V4 is a fourth array Array{var4.iter$_k$} including variables var4[n] (=ΔGy[n]) indicating the profile of the change rate of the magnitude or intensity of the gradient magnetic field per unit distance along the y-axis direction according to time.

A fifth variable V5 is a fifth array Array{var5.iter$_k$} including variables var5[n] (=ΔGz[n]) indicating the profile of the change rate of the magnitude or intensity of the gradient magnetic field per unit distance along the z-axis direction according to time.

A sixth variable V6 is a basic magnetic field B0 provided by the MRI scanner in which the RF pulse is provided.

The simulator 120 may receive the six types of variables to simulate and calculate an induced magnetic field $M_{p,q,r}$ that is induced from each of voxels defined in the scan space of the MRI scanner in which the RF pulse RF[n], the basic magnetic field B0, and the gradient magnetic field $G_{p,q,r}(n)$ are provided. A specific method for this simulation may be selected from among conventional techniques. The present invention is not limited by the specific method for the simulation.

Each simulated induced magnetic field $M_{simulated(p,q,r)}$ induced on each voxel may be defined as a vector value. Therefore, each simulated induced magnetic field $M_{simulated(p,q,r)}$ may include an x component $Mx_{simulated(p,q,r)}$, a y component $My_{simulated(p,q,r)}$, and z component $Mz_{simulated(p,q,r)}$.

Since a plurality of voxels are provided along each of the x axis, y axis and z axis, the simulated induced magnetic field $M_{simulated(p,q,r)}$ may be calculated for each voxel so as to be provided in plurality. Therefore, the x components of the simulated induced magnetic field $M_{simulated(p,q,r)}$ may be provided for each voxel, and this may be referred to as a first S-induced magnetic field array Array{$Mx_{simulated(p,q,r)}$}. Furthermore, the y components of the simulated induced magnetic field $M_{simulated(p,q,r)}$ may be provided for each voxel, and this may be referred to as a second S-induced magnetic field array Array{$My_{simulated(p,q,r)}$}. Furthermore, the z components of the simulated induced magnetic field $M_{simulated(p,q,r)}$ may be provided for each voxel, and this may be referred to as a third S-induced magnetic field array Array($Mz_{simulated(p,q,r)}$).

The first S-induced magnetic field array Array{$Mx_{simulated(p,q,r)}$}, the second S-induced magnetic field array Array{$My_{simulated(p,q,r)}$}, and the third S-induced magnetic field array Array{$Mz_{simulated(p,q,r)}$} may be expressed in a vector form and simply referred to as simulated induced magnetic field array Array{$M_{simulated(p,q,r)}$}.

The simulator 120 may provide a portion or entirety of the simulated induced magnetic field array Array{$M_{simulated(p,q,r)}$} to a distance calculator 130.

In the embodiment illustrated in FIG. 4, it is assumed that the simulated induced magnetic field array Array{$M_{simulated(p,q,r)}$} provided to the distance calculator 130 is the third S-induced magnetic field array Array{$Mz_{simulated(p,q,r)}$}.

However, in another embodiment, the simulated induced magnetic field array provided to the distance calculator 130 may be the first S-induced magnetic field array Array{$Mx_{simulated(p,q,r)}$} or the second S-induced magnetic field array Array{$My_{simulated(p,q,r)}$}.

Alternatively, in another embodiment, an induced magnetic field array provided to the distance calculator 130 may be the simulated induced magnetic field array Array{$M_{simulated(p,q,r)}$}.

The computing device may receive, from the DB 110, a spatial profile of a desired induced magnetic field, i.e., a desired induced magnetic field array Array{$M_{DESIRED(p,q,r)}$}.

The desired induced magnetic field array Array{$M_{DESIRED(p,q,r)}$} may be stored in the DB 110 as a seventh variable.

The seventh variable V7 may include the desired induced magnetic field array Array{$M_{DESIRED(p,q,r)}$} including magnitudes of desired induced magnetic fields desired to be induced from each of a plurality of voxels. The desired induced magnetic field array Array{$M_{DESIRED(p,q,r)}$} may include, for each of x, y, z components thereof, a first D-induced magnetic field array Array{$Mx_{DESIRED(p,q,r)}$}, a second D-induced magnetic field array Array{$My_{DESIRED(p,q,r)}$}, and a third D-induced magnetic field array Array{$M_{DESIRED(p,q,r)}$}.

In the embodiment illustrated in FIG. 4, the third D-induced magnetic field array Array{$Mz_{DESIRED(p,q,r)}$} is exemplarily provided to the distance calculator 130.

However, in another embodiment, a desired induced magnetic field array provided to the distance calculator 130 may be the first D-induced magnetic field array Array{$Mx_{DESIRED(p,q,r)}$} or the second D-induced magnetic field array Array{$My_{DESIRED(p,q,r)}$}.

In another embodiment, an induced magnetic field array provided to the distance calculator 130 may be the desired induced magnetic field array Array{$M_{DESIRED(p,q,r)}$}.

The distance calculator 130 may calculate a distance between the simulated induced magnetic field array Array{$M_{simulated(p,q,r)}$} provided from the simulator 120 and the desired induced magnetic field array Array{$M_{DESIRED(p,q,r)}$} provided from the DB 110.

Here, a set of voxels corresponding to the simulated induced magnetic field array Array{$M_{simulated(p,q,r)}$} may be the same as a set of voxels corresponding to the desired induced magnetic field array Array{$M_{DESIRED(p,q,r)}$}. For example, the simulated induced magnetic field array Array{$M_{simulated(p,q,r)}$} and the desired induced magnetic field array Array{$M_{DESIRED(p,q,r)}$} may be an array including a plurality of voxels selected along a p axis in a state in which q and r among indices p, q, and r for distinguishing voxels are fixed to particular values.

FIG. 4 illustrates an example in which the distance calculator 130 calculates a distance between the third S-induced magnetic field array Array{$Mz_{simulated(p,q,r)}$} which is a simulated induced magnetic field array and the third D-induced magnetic field array Array{$Mz_{DESIRED(p,q,r)}$} which is a desired induced magnetic field array.

The third S-induced magnetic field array Array{$Mz_{simulated(p,q,r)}$} and the third D-induced magnetic field array Array{$Mz_{DESIRED(p,q,r)}$} may have the same size.

Here, the above-described distance may be defined as a value obtained by calculating differences between corresponding elements of the third S-induced magnetic field array Array{$Mz_{simulated(p,q,r)}$} and the third D-induced magnetic field array Array{$Mz_{DESIRED(p,q,r)}$} and then adding up squares of the differences.

Therefore, during a process of calculating the above-described distance, all of the first to seventh variables V1, V2, V3, V4, V5, V6, and V7 are used. Thus, in an embodiment of the present invention, the above-described distance may be expressed as Equation 6 below.

$$\text{Distance} = F(V1, V2, V3, V4, V5, V6, V7) \quad \text{[Equation 6]}$$

The above-described distance may be defined in various ways other than the above-described method, and the present invention is not limited by a specific method of defining the distance.

A differentiator 140 may calculate values by partially differentiating the calculated distance with respect to a first control variable var1, a second control variable var2, a third control variable var3, a fourth control variable var4, and a fifth control variable var5. That is, the differentiator 140 may calculate values by partially differentiating a function F (V1, V2, V3, V4, V5, V6, V7), which has the first to seventh variables V1, V2, V3, V4, V5, V6, and V7 as input variables, with respect to the first control variable var1, the second control variable var2, the third control variable var3, the fourth control variable var4, and the fifth control variable var5.

As a result, the differentiator 140 may output a first differentiation array Array{$(\partial F/\partial \text{var1}).\text{iter}_k$}, a second differentiation array Array{$(\partial F/\partial \text{var2}).\text{iter}_k$}, a third differentiation array Array{$(\partial F/\partial \text{var3}).\text{iter}_k$}, a fourth differentiation array Array{$(\partial F/\partial \text{var4}).\text{iter}_k$}, and a fifth differentiation array Array{$(\partial F/\partial \text{var5}).\text{iter}_k$} including the values obtained by partially differentiating the function with respect to the first control variable var1, the second control variable var2, the third control variable var3, the fourth control variable var4, and the fifth control variable var5.

An RF pulse profile updating part 150 may update and generate an RF pulse using the first array Array{$\text{var1}.\text{iter}_k$}, the second array Array{$\text{var2}.\text{iter}_k$}, the first differentiation array Array{$(\partial F/\partial \text{var1}).\text{iter}_k$}, and the second differentiation array Array{$(\partial F/\partial \text{var2}).\text{iter}_k$}. To this end, following Equation 7 may be used.

$$\text{var1}[n].\text{iter}_{k+1} = \text{var1}[n].\text{iter}_k + \alpha \Box \partial F/\partial \text{var1}[n].\text{iter}_k$$

$$\text{var2}[n].\text{iter}_{k+1} = \text{var2}[n].\text{iter}_k + \alpha \Box \partial F/\partial \text{var2}[n].\text{iter}_k \quad \text{[Equation 7]}$$

That is, a value obtained by scaling the first differentiation array Array{$(\partial F/\partial \text{var1}).\text{iter}_k$} with a predetermined scaling factor $\alpha$ may be added to the first array Array{$\text{var1}.\text{iter}_k$} constituting the RF pulse$_k$ $RF_k[n]$, and a resultant value may be used as a first array Array{$\text{var1}.\text{iter}_{k+1}$} constituting a new RF pulse$_{k+1}$ $RF_{k+1}[n]$. Furthermore, a value obtained by scaling the second differentiation array Array{$(\partial F/\partial \text{var2}).\text{iter}_k$} with the predetermined scaling factor $\alpha$ may be added to the second array Array{$\text{var2}.\text{iter}_k$} constituting the RF pulse$_k$ $RF_k[n]$, and a resultant value may be used as a second array Array{$\text{var2}.\text{iter}_{k+1}$} constituting the new RF pulse$_{k+1}$ $RF_{k+1}[n]$.

Through this process, a relationship between a value of the newly updated RF pulse$_{k+1}$ $RF_{k+1}[n]$ sampled at a particular time point and a value of the RF pulse$_k$ $RF_k[n]$ sampled at the particular time point is expressed Equation 8.

$$RF_{k+1}[n] = \text{var1}[n].\text{iter}_{k+1} * \exp\{j\Box\text{var2}[n], \text{iter}_{k+1}\} = \quad \text{[Equation 8]}$$

$$(\text{var1}[n].\text{iter}_k + \alpha\Box\partial F/\partial \text{var1}[n].\text{iter}_k)^* \exp$$

$$\{j\Box\text{var2}[n].\text{iter}_k + \alpha\Box\partial F/\partial \text{var2}[n].\text{iter}_k\} =$$

$$\text{Amp}[n].\text{iter}_{k+1} * \exp\{j\Box\text{phase}[n].\text{iter}_{k+1}\}$$

When the above-described process is repeated for the new RF pulse$_{k+1}$ $RF_{k+1}[n]$, a new RF pulse$_{k+2}$ $RF_{k+2}[n]$ may be obtained.

A gradient magnetic field profile updating part 160 may update and generate a gradient magnetic field profile using the third array Array{$\text{var3}.\text{iter}_k$}, the fourth array Array{$\text{var4}.\text{iter}_k$}, the fifth array Array{$\text{var5}.\text{iter}_k$}, the third differentiation array Array{$(\partial F/\partial \text{var3}).\text{iter}_k$}, the fourth differentiation array Array{$(\partial F/\partial \text{var4}).\text{iter}_k$}, and the fifth differentiation array Array{$(\partial F/\partial \text{var5}).\text{iter}_k$}. To this end, following Equation 9 may be used.

$$\text{var3}[n].\text{iter}_{k+1} = \text{var3}[n].\text{iter}_k + \beta\Box\partial F/\partial \text{var3}[n].\text{iter}_k$$

$$\text{var4}[n].\text{iter}_{k+1} = \text{var4}[n].\text{iter}_k + \beta\Box\partial F/\partial \text{var3}[n].\text{iter}_k$$

$$\text{var5}[n].\text{iter}_{k+1} = \text{var5}[n].\text{iter}_k + \beta\Box\partial F/\partial \text{var3}[n].\text{iter}_k \quad \text{[Equation 9]}$$

That is, a new third array Array{$\text{var3}.\text{iter}_{k+1}$} may be generated by adding a value obtained by scaling the third differentiation array Array{$(\partial F/\partial \text{var3}).\text{iter}_k$} with a predetermined scaling factor $\beta$ to the third array Array{$\text{var3}.\text{iter}_k$} including variables var3[n] (=$\Delta Gx[n]$) that indicate the profile of the change rate of the magnitude or intensity of the gradient magnetic field per unit distance along the x-axis direction according to time.

Furthermore, a new fourth array Array{$\text{var4}.\text{iter}_{k+1}$} may be generated by adding a value obtained by scaling the fourth differentiation array Array{$(\partial F/\partial \text{var4}).\text{iter}_k$} with the predetermined scaling factor $\beta$ to the fourth array Array{$\text{var4}.\text{iter}_k$} including variables var4[n] (=$\Delta Gy[n]$) that indicate the profile of the change rate of the magnitude or intensity of the gradient magnetic field per unit distance along the y-axis direction according to time.

Furthermore, a new fifth array Array{$\text{var5}.\text{iter}_{k+1}$} may be generated by adding a value obtained by scaling the fifth differentiation array Array{$(\partial F/\partial \text{var5}).\text{iter}_k$} with the predetermined scaling factor $\beta$ to the fifth array Array{$\text{var5}.\text{iter}_k$} including variables var5[n] (=$\Delta Gz[n]$) that indicate the profile of the change rate of the magnitude or intensity of the gradient magnetic field per unit distance along the z-axis direction according to time.

The scaling factor β may have a value equal to or different from the scaling factor α.

As described above, a gradient magnetic field profile$_k$ (V3, V4, V5) expressed by reference sign k may be updated by the gradient magnetic field profile updating part 160 into a new gradient magnetic field profile$_{k+1}$ (V3', V4', V5') expressed by reference sign k+1.

When the above-described process is repeated for the new gradient magnetic field profile$_{k+1}$, a new gradient magnetic field profile$_{k+2}$ may be obtained.

This process may be continuously repeated, and, when the above-described distance decreases to a preset value or less, the RF pulse updating process and the gradient magnetic field profile updating process may be ended.

A final RF pulse and a final gradient magnetic field profile obtained when the RF pulse updating process and the gradient magnetic field profile updating process are ended may be stored in the computing device.

The final RF pulse and the final gradient magnetic field profile may be stored in a volatile storage or non-volatile storage of the computing device.

In an embodiment, information about the stored final RF pulse and final gradient magnetic field profile may be transmitted to the MRI scanner via a local communication network or a network communication network. Here, the local communication network may represent a LAN cable, a local communication cable, or the like for connecting the computing device and the MRI scanner to each other. Furthermore, the network communication network may be a communication network including a service server of an Internet service provider (ISP) for connecting the computing device to a remotely located MRI scanner.

In another embodiment, information about the stored final RF pulse and final gradient magnetic field profile may be transmitted, via the local communication network or the network communication network, to a second computing device which operates the MRI scanner. The second computing device may be a server. The second computing device may drive, based on a command input thereto, a current driver for generating an RF pulse and a gradient magnetic field of the MRI scanner using the information about the final RF pulse and final gradient magnetic field profile. The second computing device may also be a control computing device integrated with the MRI scanner.

Figure 5:
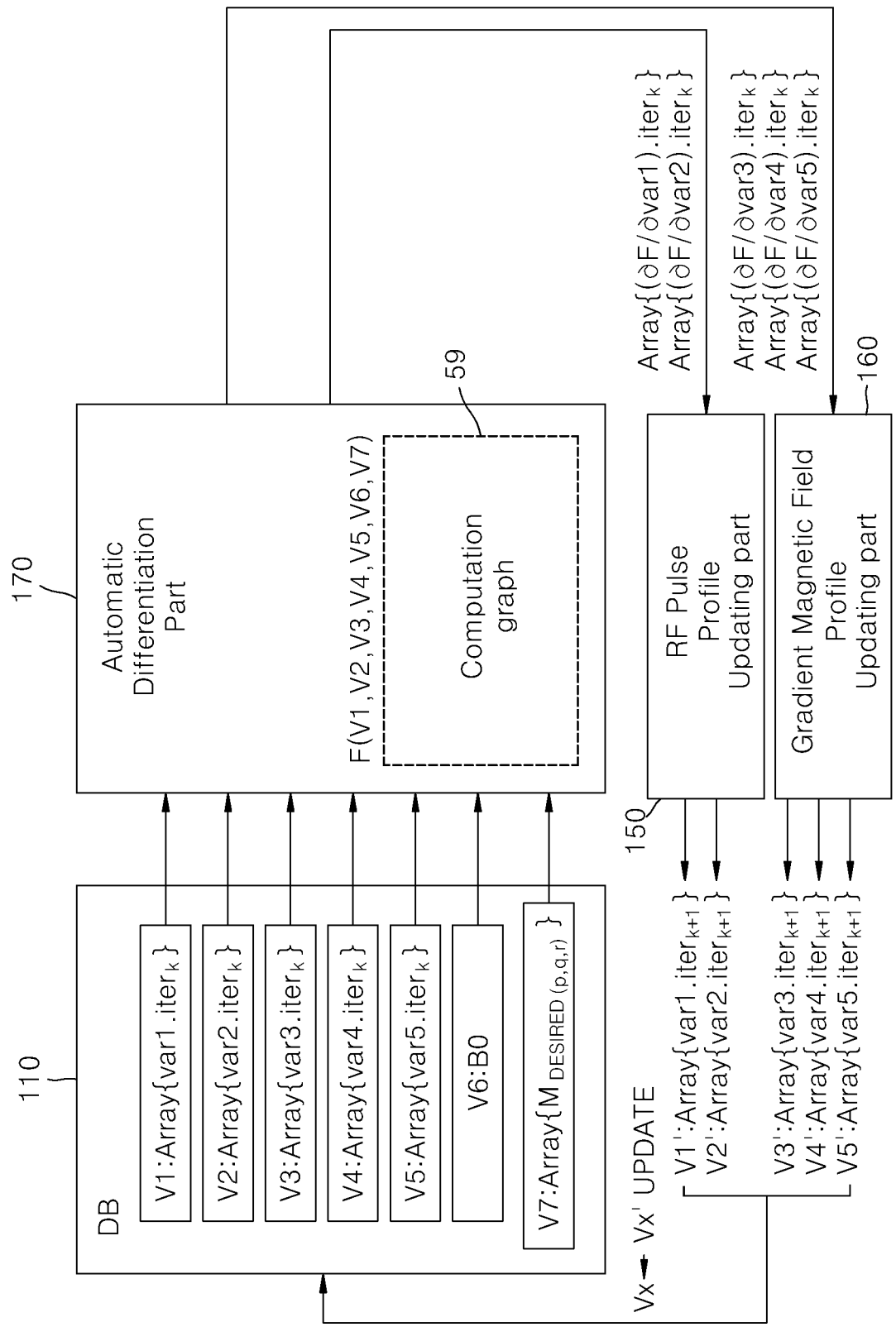
FIG. 5 is a block diagram illustrating a method of generating an RF pulse and a gradient magnetic field, provided according to another embodiment of the present invention.

FIG. 5 is a block diagram illustrating a method of generating an RF pulse and a gradient magnetic field, provided according to another embodiment of the present invention.

FIG. 5 illustrates a modification example of the embodiment of FIG. 4, and, in this example, functions of the simulator 120, the distance calculator 130, and the differentiator 140 of FIG. 4 are replaced with an automatic differentiation part 170.

Figure 6:
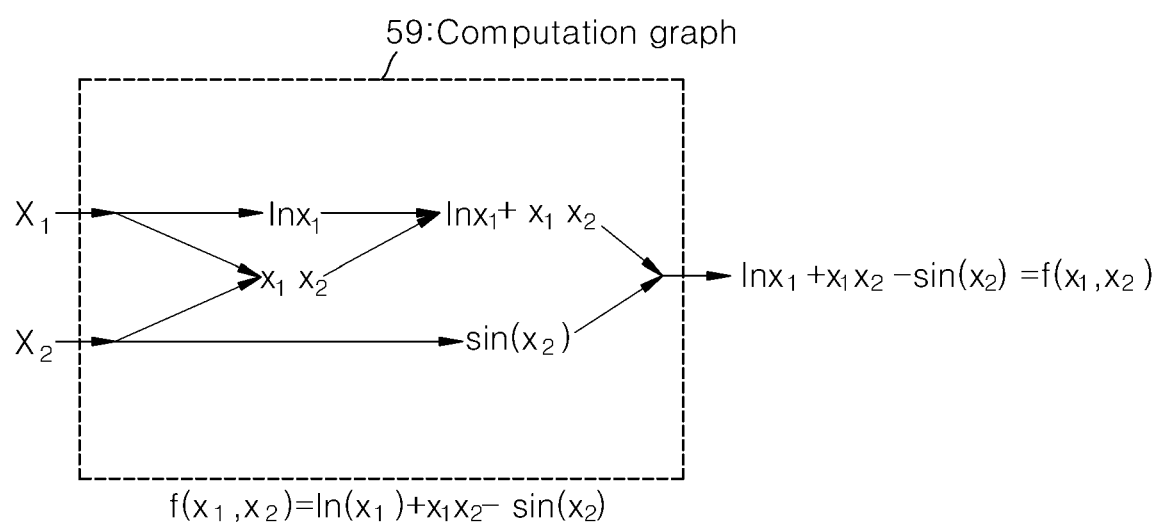
FIG. 6 is an exemplary diagram for describing a structure of an automatic differentiation part.

FIG. 6 is an exemplary diagram for describing a structure of an automatic differentiation part.

Figure 7:
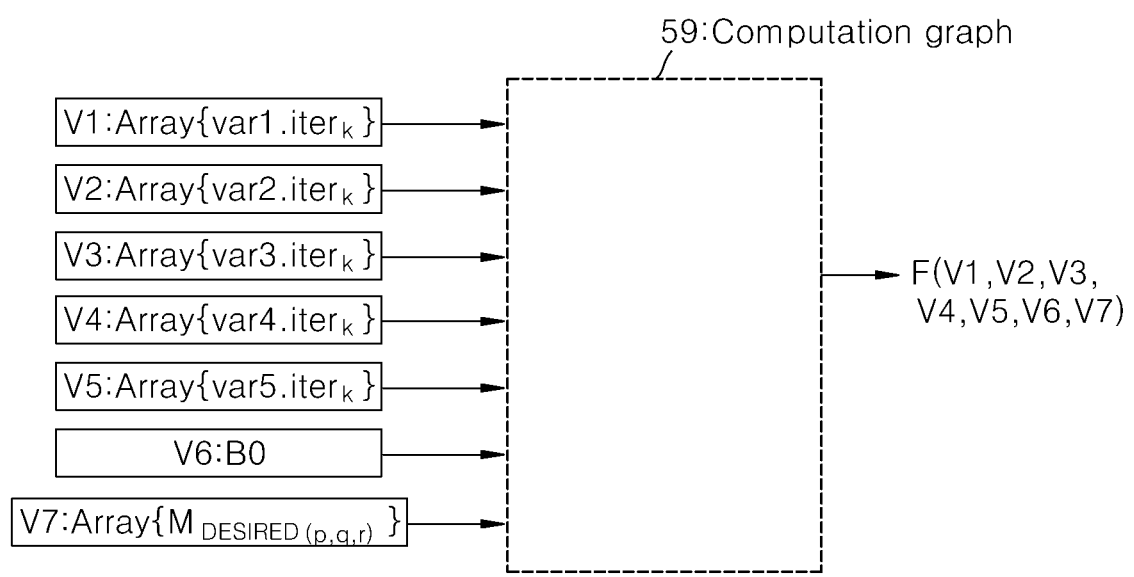
FIG. 7 illustrates input data and a target function of an automatic differentiation part used in the present invention.

FIG. 7 illustrates input data and a target function of an automatic differentiation part used in the present invention.

The automatic differentiation part 170 which is a known technology may include a computation graph 59 therein. The computation graph 59 may include a graph of a tree structure including a plurality of nodes and links, and is configured to implement a predetermined target function which uses variables input to the computation graph 59 as input variables.

For example, when the input variables are $x_1$ and $x_2$, and the target function $f(x_1, x_2) = \ln(x_1) + x_1 x_2 - \sin(x_2)$ is given, the target function may be implemented by configuring the computation graph 59 illustrated in FIG. 6.

Therefore, as illustrated in FIG. 7, the first to seventh variables V1, V2, V3, V4, V5, V6, and V7 may be used as the input variables of the computation graph 59 illustrated in FIG. 5, and the function F(V1, V2, V3, V4, V5, V6, V7) indicating the above-described distance may be used as the target function.

Here, a specific method for designing an internal structure of the computation graph 59 to implement the target function from the input variables depends on a designer's decision. The present invention is not limited by the specific method for designing the internal structure of the computation graph 59.

The automatic differentiation part 170 is configured to calculate partially differentiated values of each of the variables for the target function by executing a forward mode or a reverse mode. Therefore, it may be understood that the automatic differentiation part 170 of FIG. 5 may substitute for the functions of the simulator 120, the distance calculator 130, and the differentiator 140 of FIG. 4.

Figure 8:
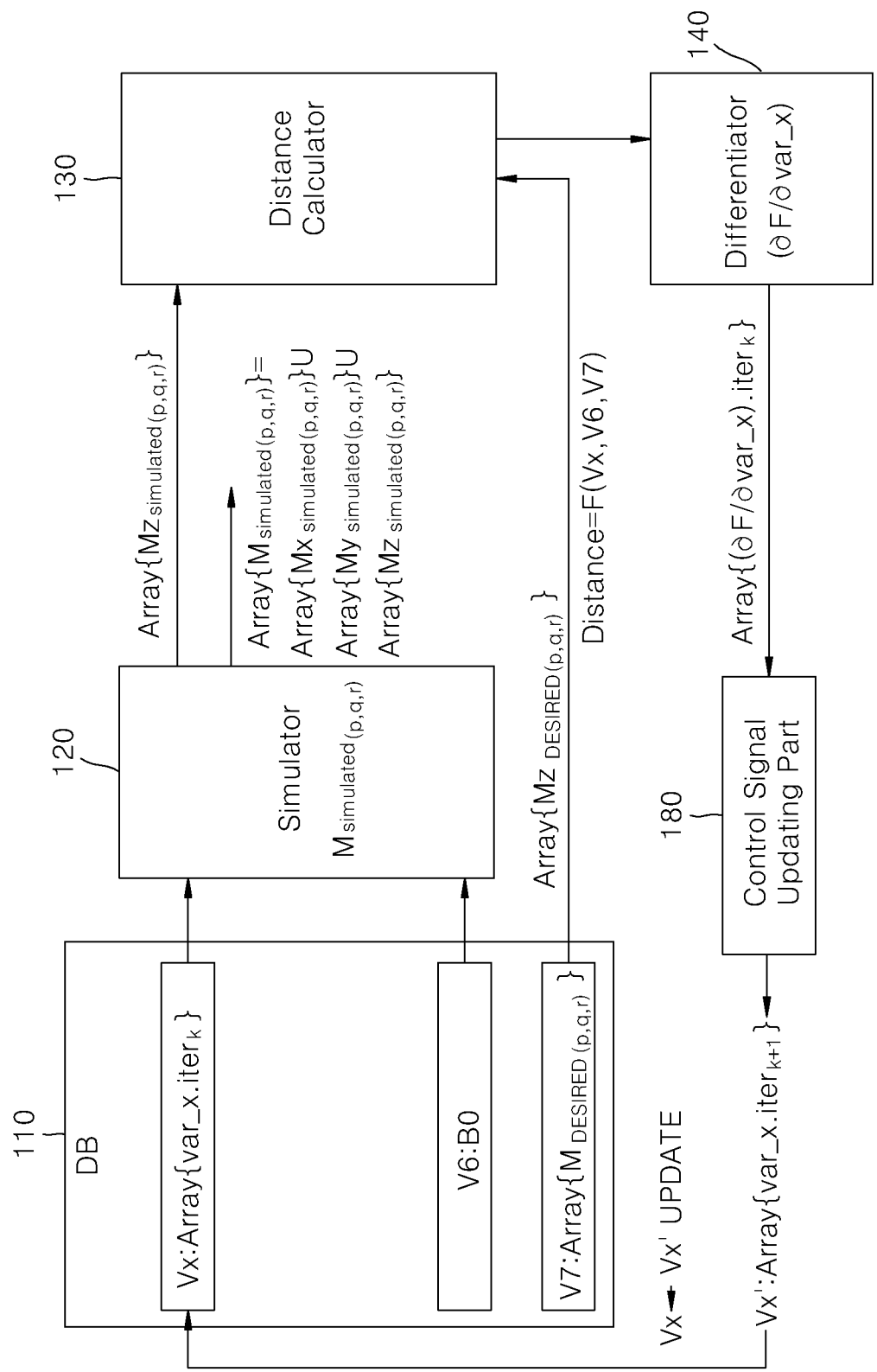
FIG. 8 is a diagram illustrating a control signal updating method provided according to an embodiment of the present invention.

FIG. 8 is a diagram illustrating a control signal updating method provided according to an embodiment of the present invention.

FIG. 8 illustrates a modification example of the embodiment of FIG. 4, and, in this example, only one variable array Vx among five variable arrays V1, V2, V3, V4, and V5 is used.

Figure 9:
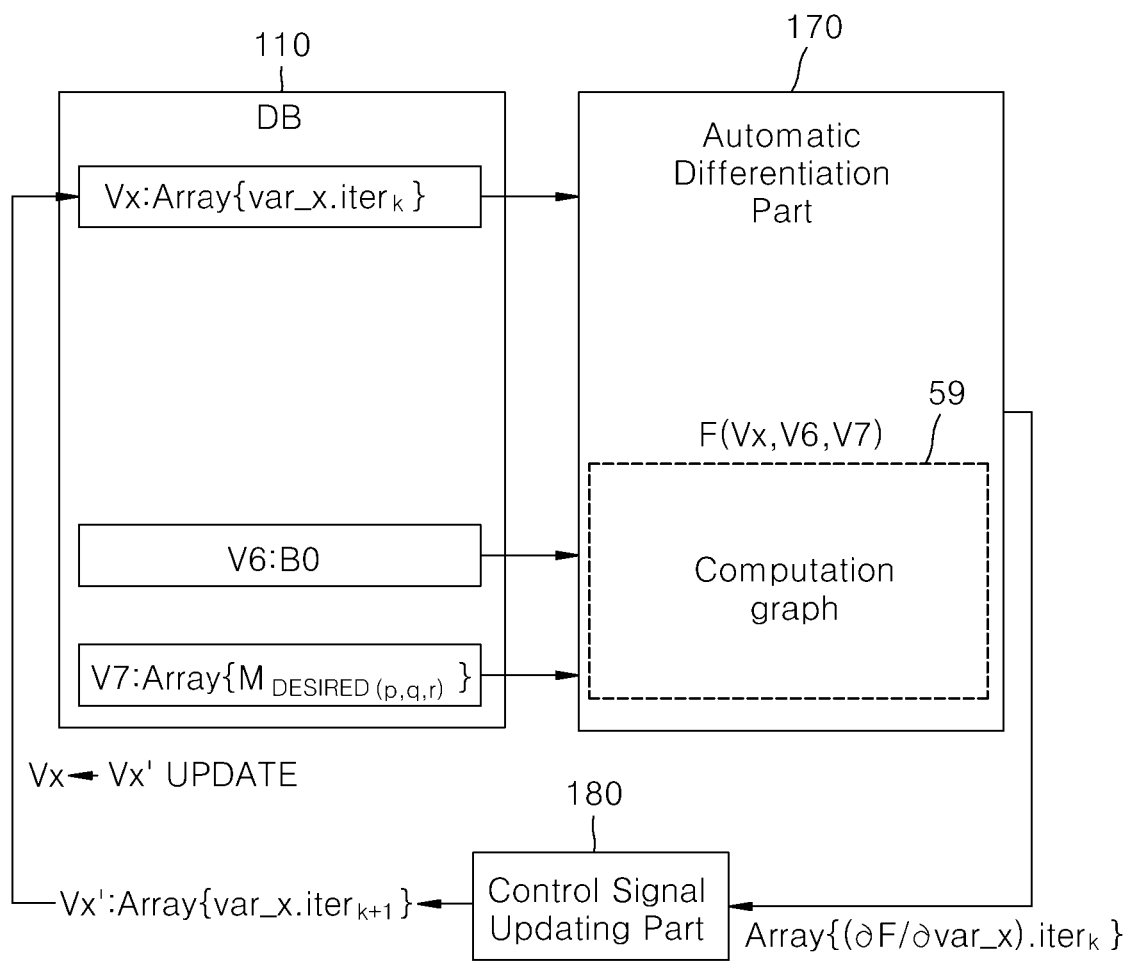
FIG. 9 is a diagram illustrating a control signal updating method provided according to another embodiment of the present invention.

FIG. 9 is a diagram illustrating a control signal updating method provided according to another embodiment of the present invention.

FIG. 9 illustrates a modification example of the embodiment of FIG. 5, and, in this example, only one variable array Vx among five variable arrays V1, V2, V3, V4, and V5 is used.

FIG. 4 and FIG. 5 illustrate examples of updating all of the five variable arrays V1, V2, V3, V4, and V5, but, even if only one of the arrays is updated, the spatial profile of a simulated induced magnetic field may be approximated to the spatial profile of a desired induced magnetic field. Therefore, the aspect of the present invention includes the concept of updating any one array or two or more selected arrays among the five variable arrays V1, V2, V3, V4, and V5.

The five variable arrays V1, V2, V3, V4, and V5 share a common role of a control signal for determining the spatial profile of an induced magnetic field. Thus, each of the five variable arrays V1, V2, V3, V4, and V5 may be referred to as a control variable array Vx or control signal Vx including time-series values of a control variable for determining the spatial profile of an induced magnetic field.

It would be easily understood that the control signal updating part 180 illustrated in FIGS. 8 and 9 collectively refers to the RF pulse profile updating part 150 and the gradient magnetic field profile updating part 160 illustrated in FIGS. 4 and 5.

Figure 10A:
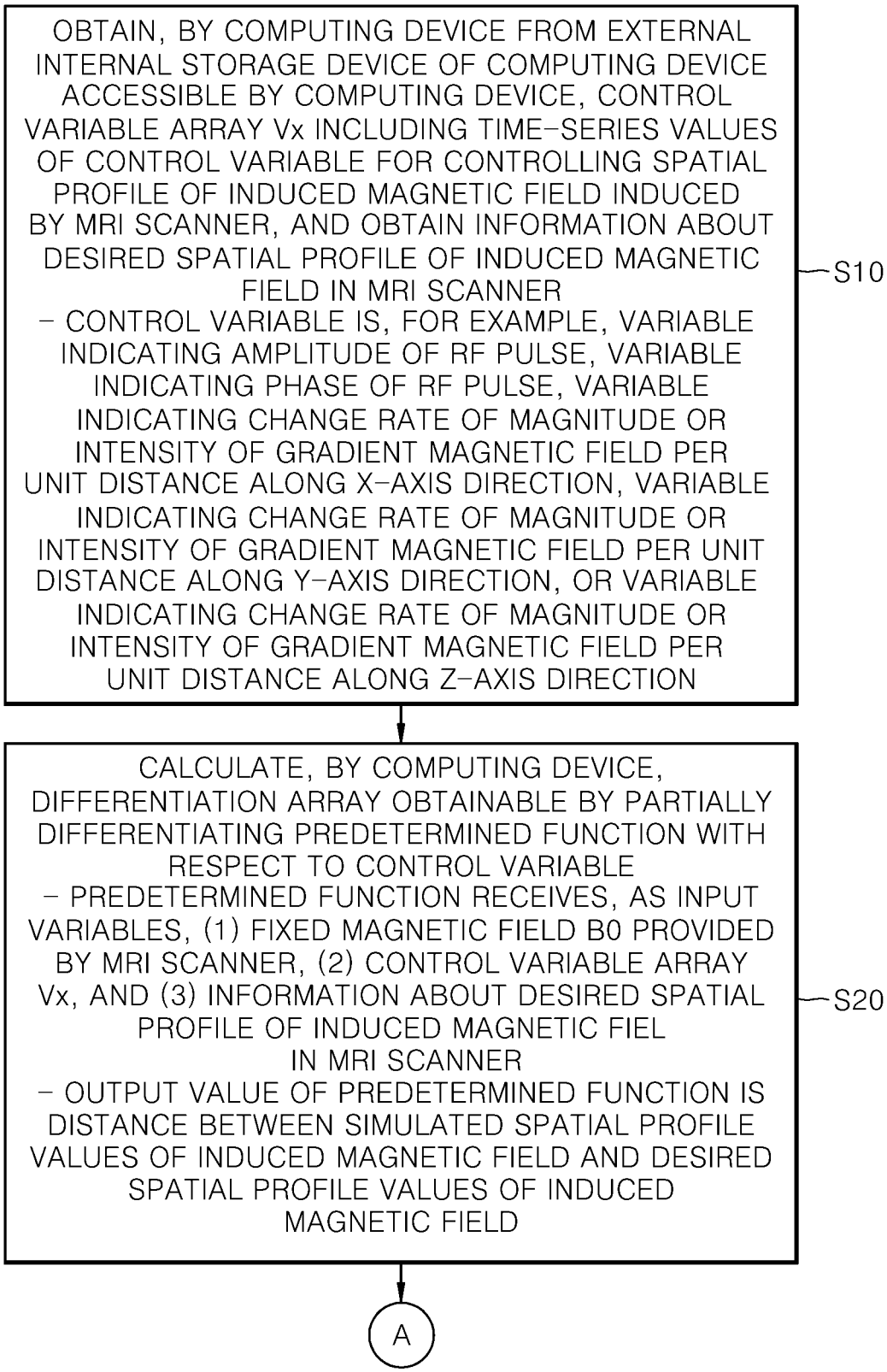
FIG. 10A and FIG. 10B show a flowchart illustrating a control signal providing method provided according to an embodiment of the present invention.
Figure 10B:
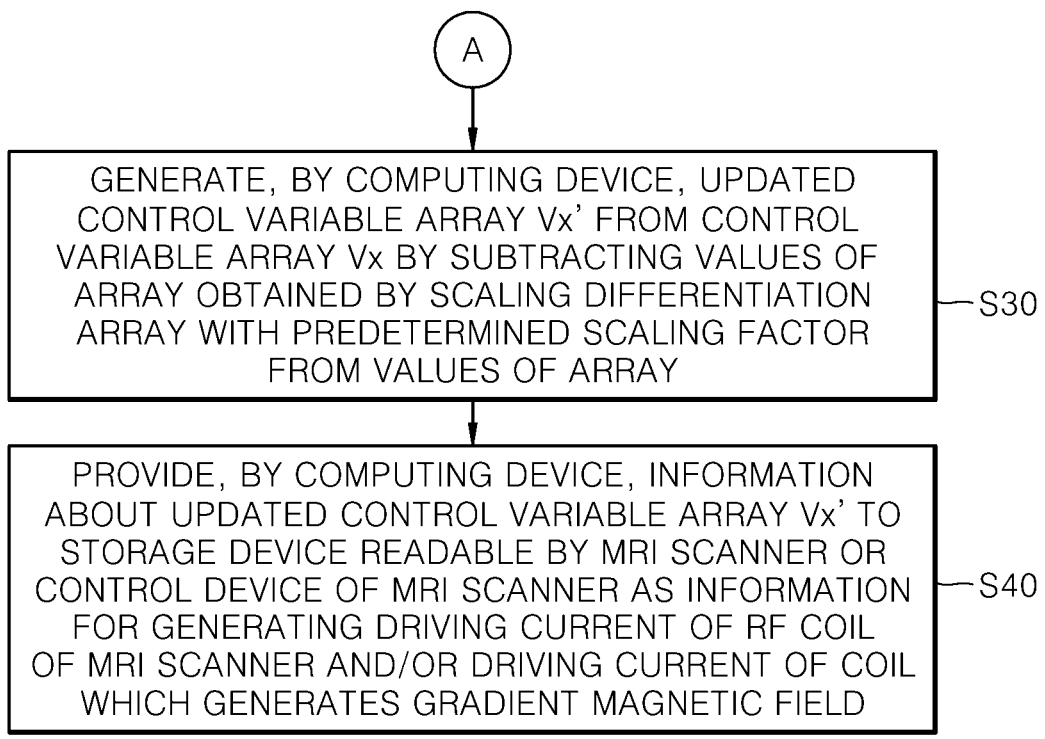

FIG. 10A and FIG. 10B show a flowchart illustrating a control signal providing method provided according to an embodiment of the present invention.

Referring to FIG. 10A and FIG. 10B, the control signal providing method may include the following operations.

In operation S10, a computing device may obtain, from an external or internal storage device of the computing device accessible by the computing device, a control variable array Vx including time-series values of a control variable for controlling the spatial profile of an induced magnetic field induced by an MRI scanner, and may obtain information about a desired spatial profile of the induced magnetic field in the MRI scanner.

Here, the control variable, for example, may be a variable indicating the amplitude of an RF pulse, a variable indicating the phase of the RF pulse, a variable indicating the change rate of the magnitude or intensity of a gradient magnetic field per unit distance along the x-axis direction, a variable indicating the change rate of the magnitude or intensity of the gradient magnetic field per unit distance along the y-axis direction, or a variable indicating the change rate of the magnitude or intensity of the gradient magnetic field per unit distance along the z-axis direction.

In operation S20, the computing device may calculate a differentiation array that may be obtained by partially differentiating a predetermined function with respect to the control variable.

Here, the predetermined function may receive, as input variables, (1) the fixed magnetic field B0 provided by the MRI scanner, (2) the control variable array Vx, and (3) the information about the desired spatial profile of the induced magnetic field in the MRI scanner.

Here, spatial profiles of the fixed magnetic field B0, a gradient magnetic field generated based on the control variable array Vx, and an induced magnetic field induced by a variable magnetic field caused by an RF pulse generated based on the control variable array Vx may be obtained through simulation.

Furthermore, an output value of the predetermined function may be a distance between simulated spatial profile values of the induced magnetic field and desired spatial profile values of the induced magnetic field.

In operation S30, the computing device may generate an updated control variable array Vx' from the control variable array Vx by subtracting values of an array obtained by scaling the differentiation array with a predetermined scaling factor from values of the control variable array.

In operation S40, the computing device may provide information about the updated control variable array Vx' to a storage device readable by the MRI scanner or a control device of the MRI scanner as information for generating a driving current of an RF coil of the MRI scanner and/or a driving current of a coil which generates a gradient magnetic field.

Alternatively, in operation S41 instead of operation S40, the computing device may repeat operation S10, operation S20, and operation S30 by replacing the updated control variable array Vx' with the control variable array Vx of operation S10.

Figure 11A:
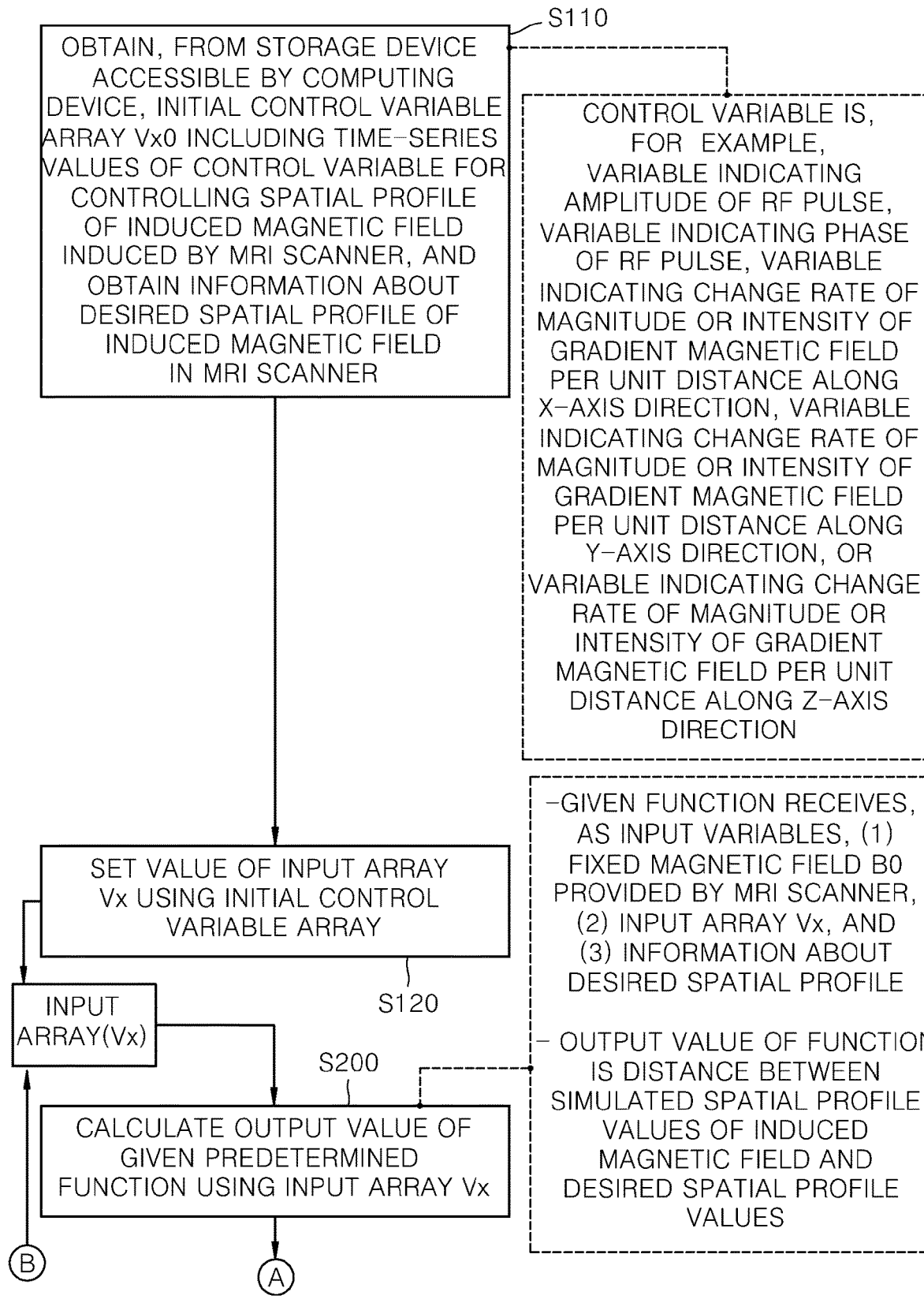
FIG. 11A and FIG. 11B show a flowchart illustrating a control signal providing method provided according to an embodiment of the present invention.
Figure 11B:
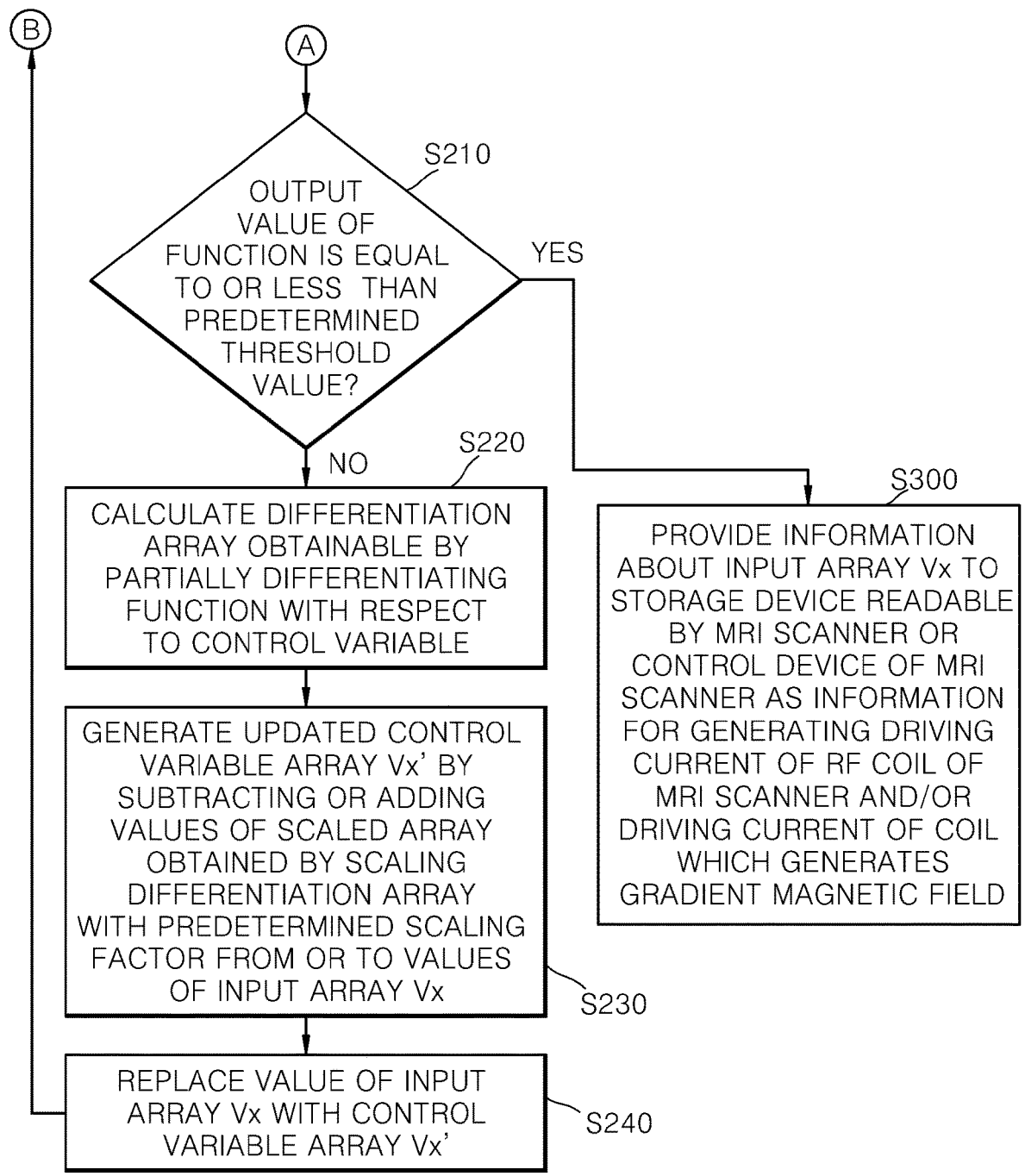

FIG. 11A and FIG. 11B show a flowchart illustrating a control signal providing method provided according to an embodiment of the present invention.

Referring to FIG. 11A and FIG. 11B, the control signal providing method may include the following operations.

In operation S110, a computing device may obtain, from an internal or external storage device of the computing device accessible by the computing device, an initial control variable array Vx0 including time-series values of a control variable var_x for controlling the spatial profile of an induced magnetic field induced by an MRI scanner, and may obtain information V7 about a desired spatial profile of the induced magnetic field in the MRI scanner.

Here, the control variable var_x, for example, may be a variable var1 indicating the amplitude of an RF pulse, a variable var2 indicating the phase of the RF pulse, a variable var3 indicating the change rate of the magnitude or intensity of a gradient magnetic field per unit distance along the x-axis direction, a variable var4 indicating the change rate of the magnitude or intensity of the gradient magnetic field per unit distance along the y-axis direction, or a variable var5 indicating the change rate of the magnitude or intensity of the gradient magnetic field per unit distance along the z-axis direction.

The initial control variable array Vx0 may include all or selected portion of the above-described various types of control variables.

In operation S120, the computing device may replace a value of a predetermined input array Vx with a value of the initial control variable array Vx0.

The input array Vx may be one used to use an output value of the given predetermined function described below.

Here, the given function may receive, as input variables, (1) the fixed magnetic field B0 provided by the MRI scanner, (2) the input array Vx, and (3) the information V7 about the desired spatial profile. Furthermore, the output value of the function may be a distance between simulated spatial profile values of the induced magnetic field and the desired spatial profile values V7.

In operation S200, the computing device may calculate the output value of the function by inputting the input array Vx to the function.

In operation S210, the computing device may determine whether the output value of the function is equal to or less than a predetermined threshold value, and the process may proceed to operation S300 if the output value is equal to or less than the threshold value, or may proceed to operation S220 if the output value is greater than the threshold value.

In operation S220, the computing device may calculate a differentiation array that may be obtained by partially differentiating the function with respect to the control variable.

In operation S230, the computing device may generate an updated control variable array Vx' by subtracting or adding values of a scaled array obtained by scaling the differentiation array with a predetermined scaling factor from or to values of the input array Vx.

In operation S240, the computing device may replace a value of the input array Vx with a value of the updated control variable array Vx'. Thereafter, the process may return to operation S200.

In operation S300, the computing device may provide information about the input array Vx to a storage device readable by the MRI scanner or a control device of the MRI scanner as information for generating a driving current of an RF coil of the MRI scanner and/or a driving current of a coil which generates a gradient magnetic field.

According to the method of the embodiment illustrated in FIG. 11A and FIG. 11B, the input array Vx which starts from the initial control variable array Vx0 is continuously updated until the output value of the predetermined function, i.e., the distance value, converges to a certain level or lower.

The flowchart illustrated in FIG. 10A and FIG. 10B may be considered to show only a last repetition procedure of the updating procedure illustrated in FIG. 11A and FIG. 11B.

Figure 12:
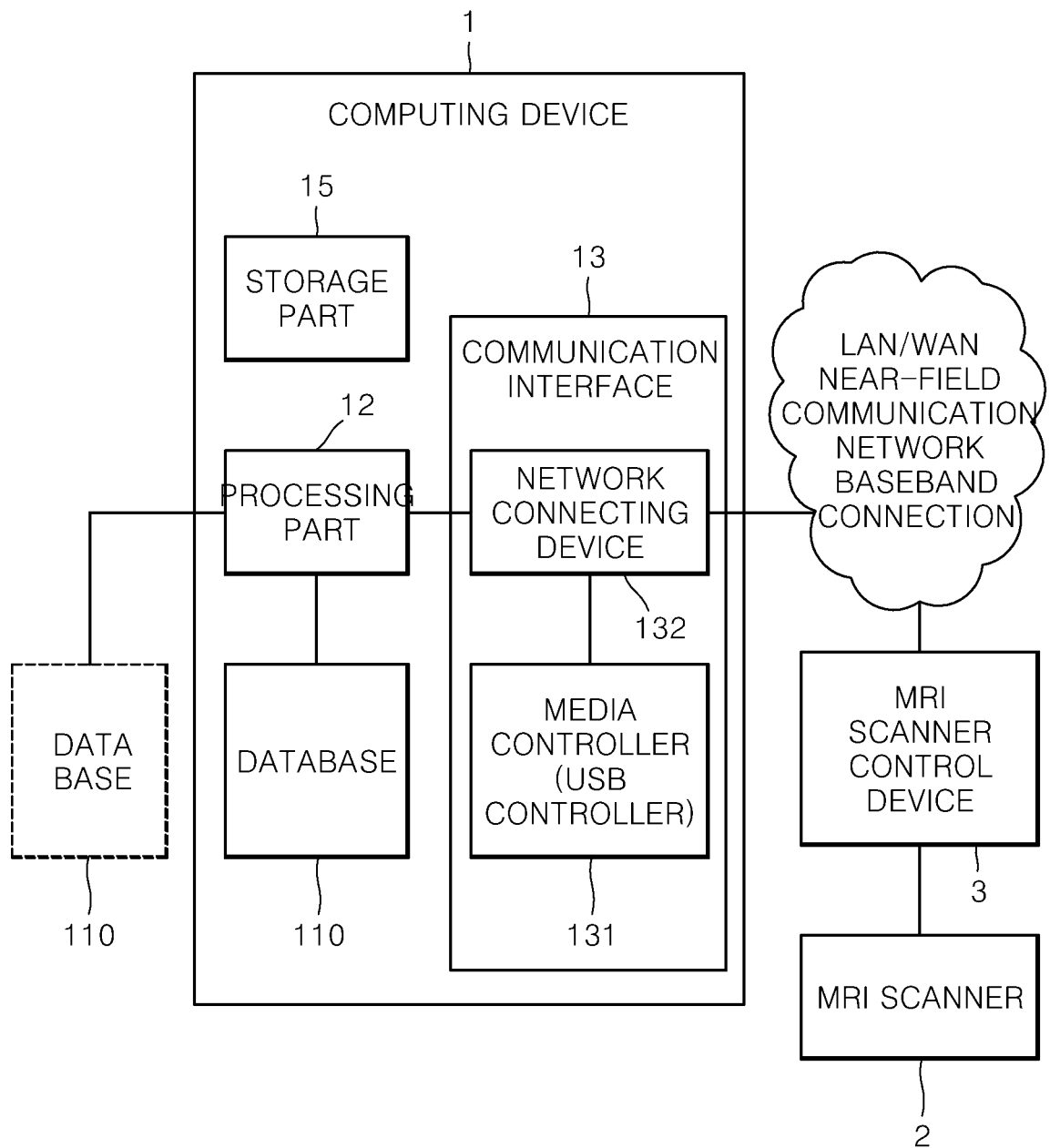
FIG. 12 illustrates a relationship between a computing device, an MRI scanner, and an MRI scanner control device provided according to an embodiment of the present invention.

FIG. 12 illustrates a relationship between a computing device, an MRI scanner, and an MRI scanner control device provided according to an embodiment of the present invention.

A computing device 1 may include a processing part 12, a storage part 15, a database 110, and a communication interface 13. In an embodiment, the database 110 may be provided separately from the computing device 1.

The communication interface 13 may include a network connecting device 132 and a media controller 131. The media controller 131 may be, for example, a USB controller.

The computing device 1 may be connected to an MRI scanner control device 3 via LAN/WAN, short-range communication network, or baseband connection. The MRI scanner control device 3 may be a device for controlling operation of an MRI scanner 2.

In an embodiment, the computing device 1 may be substantially integrated with the MRI scanner control device 3.

Program codes to be executed by the processing part 12 may be recorded in the storage part 15.

The simulator 120, the distance calculator 130, the differentiator 140, the RF pulse profile updating part 150, the gradient magnetic field profile updating part 160, the automatic differentiation part 170, and the control signal updating part 180 may be functional software modules executed by the program codes in the processing part 12.

The information about the control variable array Vx' updated and generated in the processing part 12 may be provided to the MRI scanner control device 3 via the network connecting device 132, or may be stored in a predetermined storage device via the media controller 131.

Figure 13:
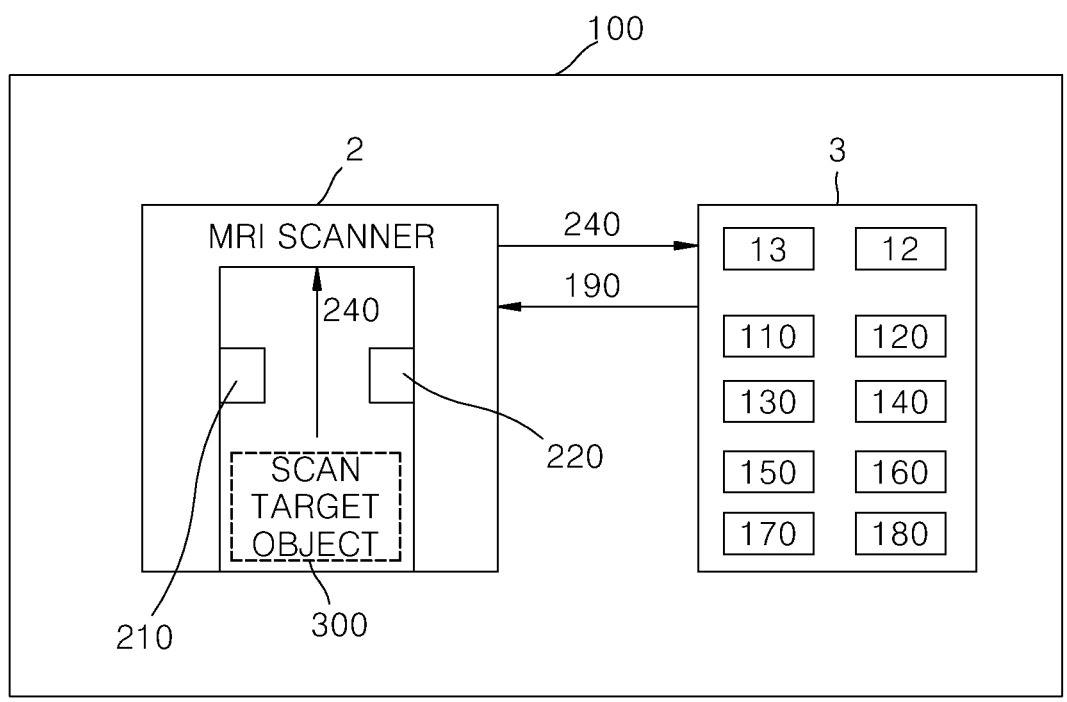
FIG. 13 is a diagram illustrating a configuration of an MRI device provided according to an embodiment of the present invention.

FIG. 13 is a diagram illustrating a configuration of an MRI device provided according to an embodiment of the present invention.

Figure 14:
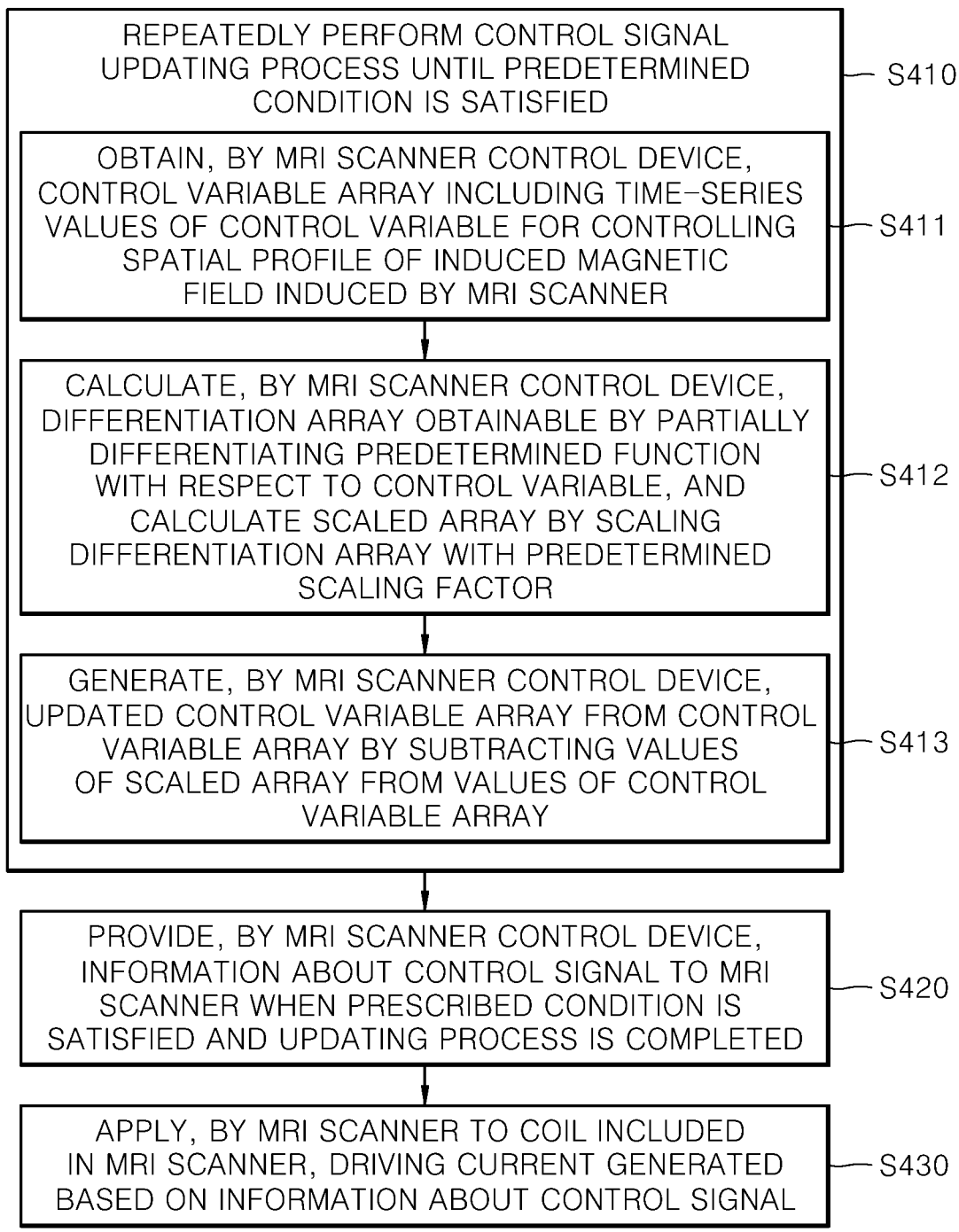
FIG. 14 illustrates a method for driving an MRI device provided according to an embodiment of the present invention.

FIG. 14 illustrates a method for driving an MRI device provided according to an embodiment of the present invention.

Descriptions will be given with reference to both FIGS. 13 and 14.

An MRI device 100 may include the MRI scanner 2 and the MRI scanner control device 3.

The MRI device 100 may include an RF coil 210 for radiating an RF pulse and a gradient magnetic field generation coil 220 used to generate a gradient magnetic field. The RF coil 210 and the gradient magnetic field generation coil 220 may be collectively referred to as a coil.

The MRI scanner control device 3 may include the processing part 12, the communication interface 13, the database 110, the simulator 120, the distance calculator 130, the differentiator 140, the RF pulse profile updating part 150, the gradient magnetic field profile updating part 160, the automatic differentiation part 170, and the control signal updating part 180.

The processing part 12 may control operation of the communication interface 13, the database 110, the simulator 120, the distance calculator 130, the differentiator 140, the RF pulse profile updating part 150, the gradient magnetic field profile updating part 160, the automatic differentiation part 170, and the control signal updating part 180 in compliance with the above-described embodiments of the present invention.

The communication interface 13 may perform a function of transmitting information 190 about a predetermined control signal generated by the MRI scanner control device 3 to the MRI scanner 2 and receiving an MRI signal 240 obtained by the MRI scanner 2 from a scan target object 300.

A method for driving the MRI device 100 including the MRI scanner 2 and the MRI scanner control device 3 according to an embodiment of the present invention may include operations S410, S420, and S430 described below.

In operation S410, a prescribed control signal updating process provided according to an embodiment of the present invention may be repeatedly performed until a prescribed condition is satisfied.

The control signal updating process may include operations S411, S412, and S413 described below.

In operation S411, the MRI scanner control device 3 may obtain a control variable array including time-series values of a control variable for controlling the spatial profile of an induced magnetic field induced by the MRI scanner 2.

In operation S412, the MRI scanner control device 3 may calculate a differentiation array that may be obtained by partially differentiating a predetermined function with respect to the control variable, and may calculate a scaled array by scaling the differentiation array with a predetermined scaling factor.

Here, the predetermined function may receive, as input variables, a fixed magnetic field provided by the MRI scanner 2, the control variable array, and information about a desired spatial profile of the induced magnetic field in the MRI scanner 2.

Furthermore, an output value of the predetermined function may be a distance between simulated spatial profile values of the induced magnetic field and desired spatial profile values of the induced magnetic field.

In operation S413, the MRI scanner control device 3 may generate an updated control variable array from the control variable array by subtracting values of the scaled array from values of the control variable array.

Each time the updating process is performed, the updated control variable array may replace the control variable array.

Here, the prescribed condition of operation S410 may be a condition that the distance between simulated spatial profile values of the induced magnetic field and desired spatial profile values of the induced magnetic field reach a prescribed threshold value or less Thereafter, in operation S420, the MRI scanner control device 3 may provide, when the prescribed condition is satisfied and the updating process is completed, the information 190 about the control signal to the MRI scanner 2.

In operation S430, the MRI scanner 2 may apply, to a coil included in the MRI scanner, a driving current generated based on the information 190 about the control signal. That is, the MRI scanner 2 may apply, to the coil included in the MRI scanner, a driving current generated using the time-series values of the control variable included in the finally updated control variable array. Here, the coil may be the RF coil 210 and/or the gradient magnetic field generation coil 220.

In operation S440, the MRI scanner 2 may transfer, to the MRI scanner control device 3, the MRI signal 240 received from the scan target object 300 due to electromagnetic waves emitted from the coil.

Figure 15:
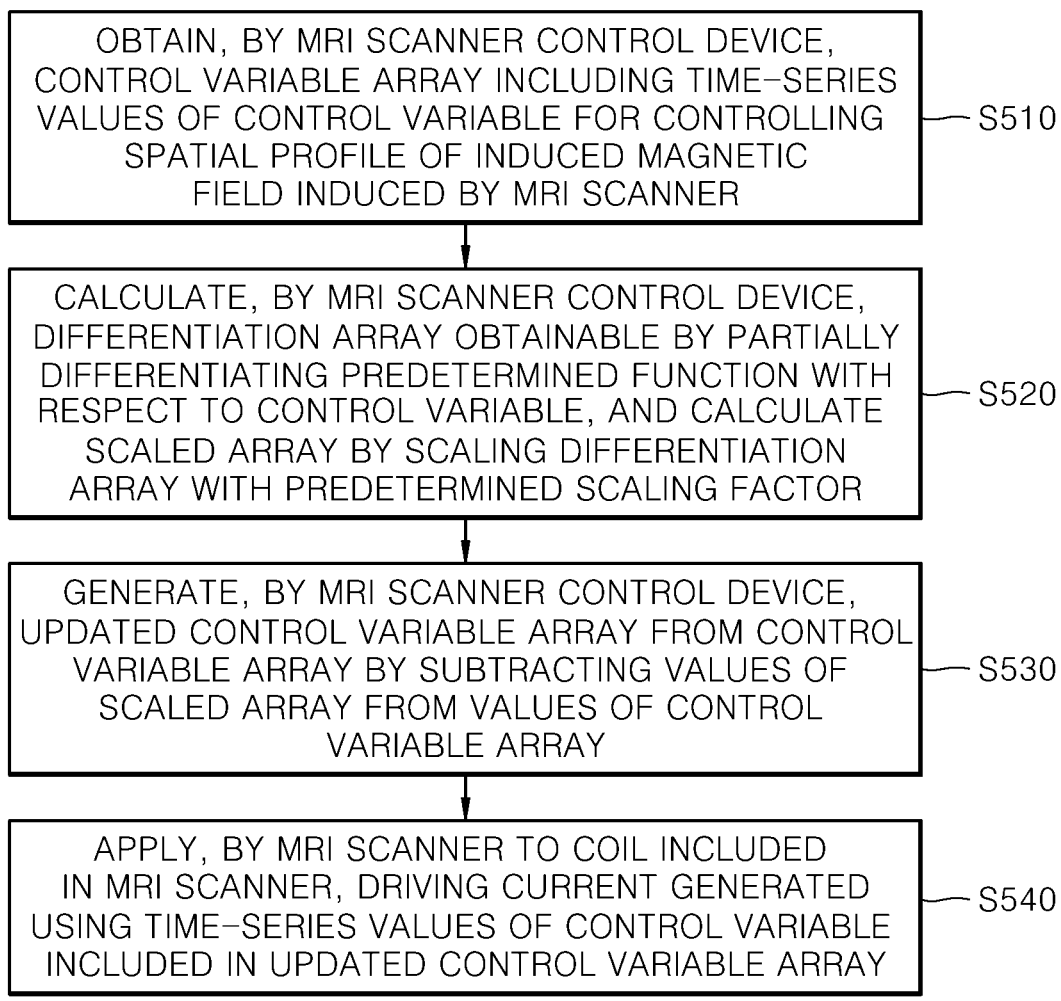
FIG. 15 illustrates a method for driving an MRI device provided according to another embodiment of the present invention.

FIG. 15 illustrates a method for driving an MRI device provided according to another embodiment of the present invention.

Descriptions will be given with reference to both FIGS. 13 and 15.

A method for driving the MRI device 100 including the MRI scanner 2 and the MRI scanner control device 3 according to another embodiment of the present invention may include the following operations.

In operation S510, the MRI scanner control device 3 may obtain a control variable array including time-series values of a control variable for controlling the spatial profile of an induced magnetic field induced by the MRI scanner 2.

In operation S520, the MRI scanner control device 3 may calculate a differentiation array that may be obtained by partially differentiating a predetermined function with respect to the control variable, and may calculate a scaled array by scaling the differentiation array with a predetermined scaling factor.

Here, the predetermined function may receive, as input variables, a fixed magnetic field provided by the MRI scanner 2, the control variable array, and information about a desired spatial profile of the induced magnetic field in the MRI scanner 2.

Furthermore, an output value of the predetermined function may be a distance between simulated spatial profile values of the induced magnetic field and desired spatial profile values of the induced magnetic field.

In operation S530, the MRI scanner control device 3 may generate an updated control variable array from the control variable array by subtracting values of the scaled array from values of the control variable array.

In operation S540, the MRI scanner 2 may apply, to the coils 210 and 220 included in the MRI scanner 2, a driving current generated using the time-series values of the control variable included in the updated control variable array.

In the present disclosure, p, q, and r may be parameters for discretely expressing x, y, and z respectively.

The present invention may provide a technology of designing the gradient magnetic field and RF pulse so as to achieve a desired spatial profile of an induced magnetic field which is desired by a user.

Although the present invention relates to a signal processing technology, results of signal processing and signal conversion according to the present invention may be used in controlling the operation of an MRI scanner, thereby bringing about technical improvement in the technical field of MRI scanning.

Those skilled in the art could easily make various alterations or modifications to the above-mentioned embodiments of the present invention without departing the essential characteristics of the present invention. The claims that do not refer to each other may be combined with each other within the scope of understanding of the present disclosure.

What is claimed is:

1. A method for driving an MRI device comprising an MRI scanner and an MRI scanner control device, the method comprising:
    obtaining, by the MRI scanner control device, a control variable array including time-series values of a control variable for controlling a spatial profile of an induced magnetic field induced by the MRI scanner;
    calculating, by the MRI scanner control device, a differentiation array obtainable by partially differentiating a predetermined function with respect to the control variable, and calculating a scaled array obtained by scaling the differentiation array with a predetermined scaling factor;
    generating, by the MRI scanner control device, an updated control variable array from the control variable array by subtracting values of the scaled array from values of the control variable array; and
    applying, by the MRI scanner, a driving current generated using the time-series values of the control variable included in the updated control variable array to a coil included in the MRI scanner,
    wherein the predetermined function receives, as input variables, a fixed magnetic field provided by the MRI scanner, the control variable array, and information about a desired spatial profile of the induced magnetic field in the MRI scanner,
    wherein an output value of the predetermined function is a distance between simulated spatial profile values of the induced magnetic field and desired spatial profile values of the induced magnetic field.

2. An MRI control signal providing method comprising:
    obtaining, by a computing device, a control variable array including time-series values of a control variable for controlling a spatial profile of an induced magnetic field induced by an MRI scanner;
    calculating, by the computing device, a differentiation array obtainable by partially differentiating a predetermined function with respect to the control variable, and calculating a scaled array obtained by scaling the differentiation array with a predetermined scaling factor; and
    generating, by the computing device, an updated control variable array from the control variable array by subtracting values of the scaled array from values of the control variable array,
    wherein the predetermined function receives, as input variables, a fixed magnetic field provided by the MRI scanner, the control variable array, and information about a desired spatial profile of the induced magnetic field in the MRI scanner,
    wherein an output value of the predetermined function is a distance between simulated spatial profile values of the induced magnetic field and desired spatial profile values of the induced magnetic field.

3. The MRI control signal providing method of claim 2, wherein the control variable comprises:
    a variable indicating an amplitude of an RF pulse output from the MRI scanner;
    a variable indicating a phase of the RF pulse;
    a variable indicating a value of a real part of the RF pulse;
    a variable indicating a value of an imaginary part of the RF pulse;
    a variable indicating a change rate of a magnitude or intensity of a gradient magnetic field per unit distance along an x-axis direction in a scan space of the MRI scanner;
    a variable indicating the change rate of the magnitude or intensity of the gradient magnetic field per unit distance along a y-axis direction in the scan space; or
    a variable indicating the change rate of the magnitude or intensity of the gradient magnetic field per unit distance along a z-axis direction in the scan space.

4. The MRI control signal providing method of claim 2,
    wherein the simulated spatial profile values of the induced magnetic field are values of an induced magnetic field calculated by a simulation at a set of voxels selected from among a plurality of voxels defined in a scan space of the MRI scanner, and
    the desired spatial profile values of the induced magnetic field are values of an induced magnetic field predefined for the set of voxels selected.

5. The MRI control signal providing method of claim 4,
    wherein the set of voxels are voxels selected according to a predetermined rule from among all of the voxels defined in the scan space, and
    the distance is a distance between component values indicating components of a particular direction among the values of an induced magnetic field calculated by the simulation and component values indicating components of the particular direction among the values of the induced magnetic field predefined.

6. The MRI control signal providing method of claim 2,
    wherein the simulated spatial profile values of the induced magnetic field and the desired spatial profile values of the induced magnetic field comprise the same number of elements, and
    wherein a procedure of calculating the distance comprises:
    calculating difference values between the simulated spatial profile values of the induced magnetic field and the desired spatial profile values of the induced magnetic field corresponding thereto;

calculating a square of each of the difference values; and
setting a value obtained by adding up all of the calculated squares as the distance.

7. The MRI control signal providing method of claim 2, wherein the method comprises a control signal updating process including the obtaining, the calculating, and the generating, wherein the control signal updating process is repeatedly executed until the distance reaches a predetermined threshold value or less, and, when the distance reaches the predetermined threshold value or less, information about the control signal is provided to a control device of the MRI scanner or a storage device readable by the control device, and wherein each time the updating process is executed, the updated control variable array replaces the control variable array.

8. The MRI control signal providing method of claim 2, wherein the calculating of the differentiation array is performed using an automatic differentiation part including a computation graph with the predetermined function as a target function.

9. The MRI control signal providing method of claim 2, further comprising providing, by the computing device, information about the updated control variable array to a control device of the MRI scanner or a storage device readable by the control device as information for generating a driving current of a coil of the MRI scanner.

10. A computing device for controlling an MRI scanner, the computing device comprising a communication interface and a processing part, wherein the processing part is configured to:

obtain a plurality of control variable arrays each including time-series values of a plurality of control variables for controlling a spatial profile of an induced magnetic field induced by the MRI scanner;

calculate a plurality of differentiation arrays obtainable by partially differentiating a predetermined function with respect to each of the control variables, and calculate a plurality of scaled arrays obtained by scaling each of the differentiation arrays with a predetermined scaling factor; and generate a plurality of updated control variable arrays from the plurality of control variable arrays by subtracting values of each of the scaled arrays from values of the corresponding control variable array, wherein the predetermined function receives, as input variables, a fixed magnetic field provided by the MRI scanner, the plurality of control variable arrays, and information about a desired spatial profile of the induced magnetic field in the MRI scanner, wherein an output value of the predetermined function is a distance between simulated spatial profile values of the induced magnetic field and desired spatial profile values of the induced magnetic field in the MRI scanner.

11. The computing device of claim 10, wherein the processing part is configured to provide information about the plurality of updated control variable arrays to a control device of the MRI scanner or a storage device readable by the control device via the communication interface as information for generating a driving current of coils of the MRI scanner.

12. The computing device of claim 10, wherein the plurality of control variables comprise:

a variable indicating an amplitude of an RF pulse output from the MRI scanner and a variable indicating a phase of the RF pulse; or a variable indicating a value of a real part of the RF pulse and a variable indicating an imaginary part of the RF pulse.

13. The computing device of claim 10, wherein the plurality of control variables comprise:

a variable indicating a change rate of a magnitude or intensity of a gradient magnetic field per unit distance along an x-axis direction in a scan space of the MRI scanner;

a variable indicating the change rate of the magnitude or intensity of the gradient magnetic field per unit distance along a y-axis direction in the scan space; and a variable indicating the change rate of the magnitude or intensity of the gradient magnetic field per unit distance along a z-axis direction in the scan space.

* * * * *